( 12 ) United States Patent
Kuribayashi et al.

(10) Patent No.: US 12,540,388 B2
(45) Date of Patent: Feb. 3, 2026

(54) METHOD OF CLEANING MEMBER IN PROCESS CONTAINER, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Koei Kuribayashi, Toyama (JP); Kenji Kameda, Toyama (JP); Tsukasa Kamakura, Toyama (JP); Takeo Hanashima, Toyama (JP); Hiroaki Hiramatsu, Toyama (JP); Shinya Ebata, Toyama (JP); Hiroto Yamagishi, Toyama (JP); Sadao Hisakado, Toyama (JP); Takafumi Sasaki, Toyama (JP); Takatomo Yamaguchi, Toyama (JP); Shuhei Saido, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 28 days.

(21) Appl. No.: 18/768,321

(22) Filed: Jul. 10, 2024

(65) Prior Publication Data

US 2024/0359218 A1 Oct. 31, 2024

Related U.S. Application Data

(63) Continuation of application No. 16/280,874, filed on Feb. 20, 2019, now Pat. No. 12,053,805.

(30) Foreign Application Priority Data

Feb. 22, 2018 (JP) .................................. 2018-029643

(51) Int. Cl.
*C23C 16/44* (2006.01)
*B08B 5/00* (2006.01)
(Continued)

(52) U.S. Cl.
CPC ............ *C23C 16/4405* (2013.01); *B08B 5/00* (2013.01); *C23C 16/45578* (2013.01); *H01L 21/0228* (2013.01)

(58) Field of Classification Search
CPC ............ C23C 16/4405; C23C 16/4401; C23C 16/4404; C23C 16/45523
See application file for complete search history.

(56) References Cited

U.S. PATENT DOCUMENTS

2009/0124083 A1\* 5/2009 Nodera ............... C23C 16/0218
156/345.24
2009/0253265 A1 10/2009 Inokuchi et al.
(Continued)

FOREIGN PATENT DOCUMENTS

CN 101783280 A 7/2010
JP 2009-117808 A 5/2009
(Continued)

OTHER PUBLICATIONS

Singaporean Search Report and Written Opinion issued Jun. 27, 2019 for Singapore Patent Application No. 10201901422S.
(Continued)

*Primary Examiner* — Kaj K Olsen
*Assistant Examiner* — Richard Z. Zhang
(74) *Attorney, Agent, or Firm* — Volpe Koenig

(57) ABSTRACT

There is provided a technique that cleans a member in a process container by performing a cycle a predetermined number of times, the cycle including: (a) separately supplying a cleaning gas and additive gas that reacts with the cleaning gas, respectively, from first and second supply parts
(Continued)

among at least three supply parts into the process container, and (b) separately supplying the cleaning and additive gases, respectively, from the second and first supply parts into the process container. (A) and (b) include stopping the supply of the cleaning and additive gases into the process container and exhausting the process container's interior. In at least one selected from the group of (a) and (b) an inert gas is supplied from each of the at least three supply parts at a same flow rate, after the supply of the cleaning and additive gases is stopped and before the process container is exhausted.

18 Claims, 13 Drawing Sheets

(51) Int. Cl.
  *C23C 16/455* (2006.01)
  *H01L 21/02* (2006.01)

(56) References Cited

U.S. PATENT DOCUMENTS

| | | | |
|---|---|---|---|
| 2009/0305517 | A1 | 12/2009 | Nakashima et al. |
| 2013/0260566 | A1 | 10/2013 | Yamazaki |
| 2014/0287594 | A1 | 9/2014 | Terasaki et al. |
| 2015/0232986 | A1* | 8/2015 | Kameda ............ C23C 16/45546 438/758 |
| 2015/0376781 | A1 | 12/2015 | Kogura et al. |
| 2016/0298235 | A1 | 10/2016 | Terasaki et al. |

FOREIGN PATENT DOCUMENTS

| | | |
|---|---|---|
| JP | 2010-157747 A | 7/2010 |
| JP | 2013-229575 A | 11/2013 |
| JP | 2015-153956 A | 8/2015 |
| KR | 20140116815 A | 10/2014 |
| KR | 20150001708 A | 1/2015 |
| TW | 201546895 A | 12/2015 |

OTHER PUBLICATIONS

Taiwanese Office Action dated Sep. 10, 2019 for Taiwanese Patent Application No. 108101671.
Korean Office Action dated Mar. 30, 2020 for Korean Patent Application No. 10-2019-0018881.
Japanese Office Action issued Jul. 7, 2020 for Japanese Patent Application No. 2018-029643.

* cited by examiner

METHOD OF CLEANING MEMBER IN PROCESS CONTAINER, METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is a continuation of U.S. patent application Ser. No. 16/280,874, filed on Feb. 20, 2019, which is based upon and claims the benefit of priority from Japanese Patent Application No. 2018-029643, filed on Feb. 22, 2018, the entire contents of which are incorporated herein by reference.

TECHNICAL FIELD

The present disclosure relates to a method of cleaning a member in a process container, a method of manufacturing a semiconductor device, a substrate processing apparatus, and a recording medium.

BACKGROUND

As an example of a process of manufacturing a semiconductor device, a process of processing a substrate in a process container is often carried out. When a predetermined amount of deposit adheres to the interior of the process container by performing such a process, a cleaning process in the process container may be performed at a predetermined timing.

SUMMARY

The present disclosure provides some embodiments of a technique capable of improving uniformity of a cleaning process in a process container.

According to some embodiments of the present disclosure, there is provided a technique that cleans a member in a process container by performing a cycle a predetermined number of times, the cycle including: (a) separately supplying a cleaning gas and an additive gas that reacts with the cleaning gas, respectively, from any two supply parts among at least three supply parts into the process container after processing a substrate; and (b) separately supplying the cleaning gas and the additive gas, respectively, from any two supply parts among the at least three supply parts into the process container, wherein at least one selected from the group of the cleaning gas and the additive gas is supplied from different supply parts in (a) and (b).

DETAILED DESCRIPTION

<One Embodiment of the Present Disclosure>

Some embodiments of the present disclosure will now be described in detail with reference to FIGS. 1 to 4.

(1) Configuration of the Substrate Processing Apparatus

Figure 1:
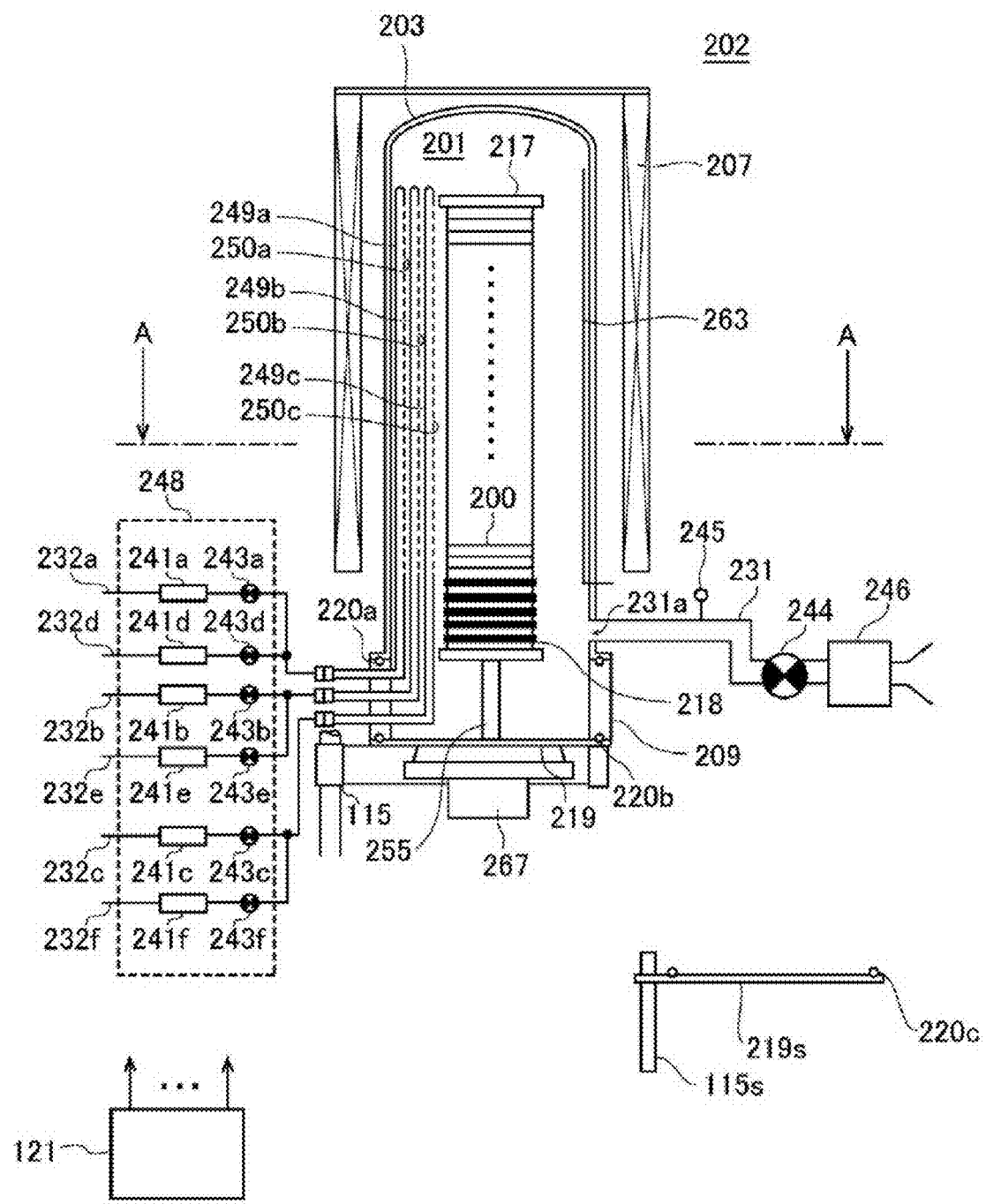
FIG. 1 is a schematic configuration diagram of a vertical type process furnace of a substrate processing apparatus suitably used in some embodiments of the present disclosure, in which a portion of the process furnace is shown in a vertical cross sectional view.

As illustrated in FIG. 1, a process furnace 202 has a heater 207 as a heating mechanism (temperature adjustment part). The heater 207 has a cylindrical shape and is supported by a retaining plate so as to be vertically installed. The heater 207 functions as an activation mechanism (an excitation part) configured to thermally activate (excite) a gas.

A reaction tube 203 is disposed inside the heater 207 in a concentric relationship with the heater 207. The reaction tube 203 is made of a heat resistant material such as, for example, quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material such as, for example, stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A process container (reaction container) is mainly configured by the reaction tube 203 and the manifold 209. A process chamber 201 is formed in a hollow cylindrical portion of the process container. The process chamber 201 is configured to accommodate wafers 200 as substrates. The processing of the wafers 200 is performed in the process chamber 201.

Nozzles 249a to 249c as first to third supply parts are installed in the process chamber 201 so as to penetrate a sidewall of the manifold 209. The nozzles 249a to 249c may also be referred to as first to third nozzles. Gas supply pipes 232a to 232c are respectively connected to the nozzles 249a to 249c. The nozzles 249a to 249c are different nozzles from each other, and the respective nozzles 249a and 249c are installed adjacent to the nozzle 249b and arranged such that the nozzle 249b is placed therebetween.

Mass flow controllers (MFCs) 241a to 241c, which are flow rate controllers (flow rate control parts), and valves 243a to 243c, which are opening/closing valves, are installed in the gas supply pipes 232a to 232c sequentially from the corresponding upstream sides of gas flow, respectively. Gas supply pipes 232d to 232f are respectively connected to the gas supply pipes 232a to 232c at the downstream side of the valves 243a to 243c. MFCs 241d to 241f and valves 243d to 243f are respectively installed in the gas supply pipes 232d to 232f sequentially from the corresponding upstream sides of gas flow.

Figure 2:
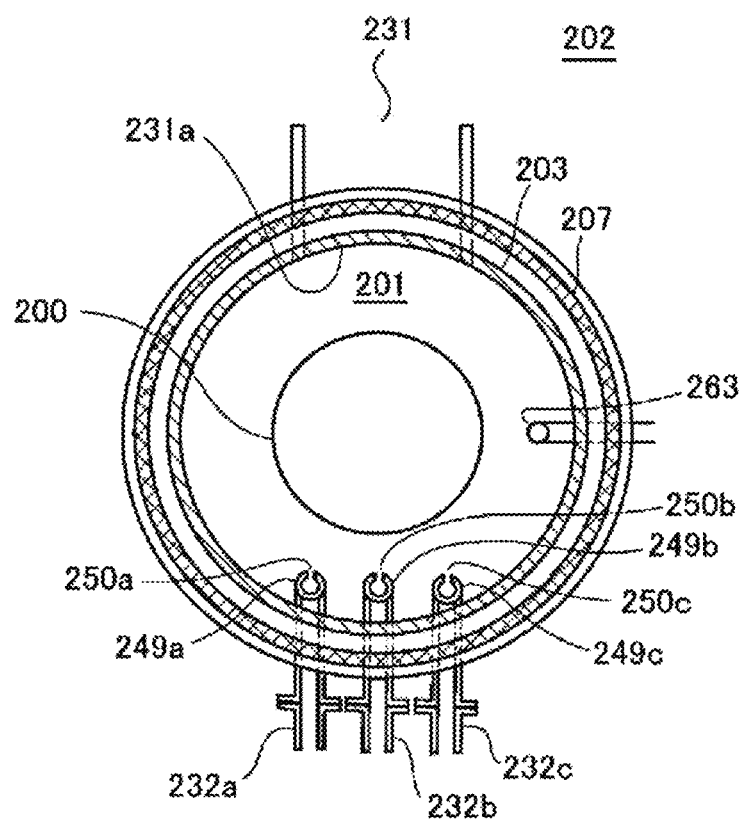
FIG. 2 is a schematic configuration diagram of the vertical type process furnace of the substrate processing apparatus suitably used in some embodiments of the present disclosure, in which a portion of the process furnace is shown in a cross sectional view taken along line A-A in FIG. 1.

As illustrated in FIG. 2, the nozzles 249a to 249c are disposed in a space with an annular plan-view shape between the inner wall of the reaction tube 203 and the wafers 200 such that nozzles 249a to 249c extend upward along a stacking direction of the wafers 200 from a lower portion of the inner wall of the reaction tube 203 to an upper portion of the inner wall of the reaction tube 203. That is, the nozzles 249a to 249c are installed at a lateral side of a wafer arrangement region in which the wafers 200 are arranged, namely in a region which horizontally surrounds the wafer arrangement region, so as to extend along the wafer arrangement region. The nozzle 249b is disposed so as to face an exhaust port 231a as described hereinbelow on a straight line in a plan view, with the centers of the wafers 200 carried into the process chamber 201 interposed therebetween. The nozzles 249a and 249c are arranged at both sides of the nozzle 249b interposed therebetween, namely along the inner wall of the reaction tube 203 (outer peripheral portion of the wafers 200) such that the nozzle 249b is placed therebetween. Gas injection hole s 250a to 250c for supplying a gas are installed on the side surfaces of the nozzles 249a to 249c, respectively. Each of the gas injection hole s 250a to 250c is opened so as to face the exhaust port 231a in plan view, allowing the gas to be supplied to the wafers 200. The gas injection hole s 250a to 250c are installed in a plural number between the lower portion of the reaction tube 203 and the upper portion of the reaction tube 203.

As a reactant of which a chemical structure (molecular structure) is different from that of a precursor as described hereinbelow, for example, a hydrogen nitride-based gas that is a nitriding gas as a nitrogen (N)-containing gas is supplied from the gas supply pipe 232a into the process chamber 201 via the MFC 241a, the valve 243a, and the nozzle 249a. The hydrogen nitride-based gas acts as an N source. As the hydrogen nitride-based gas, it may be possible to use, for example, an ammonia ($NH_3$) gas.

A precursor (precursor gas), for example, a halosilane-based gas containing silicon (Si), which is a predetermined element (main element) constituting a film, and a halogen element, is supplied from the gas supply pipe 232b into the process chamber 201 via the MFC 241b, the valve 243b, and the nozzle 249b. The precursor gas refers to a gaseous precursor, for example, a gas obtained by vaporizing a precursor which remains in a liquid state under a room temperature and an atmospheric pressure, or a precursor which remains in a gaseous state under a room temperature and a normal pressure. The halosilane refers to a silane having a halogen group. The halogen group includes a chloro group, a fluoro group, a bromo group, an iodo group, and the like. That is, the halogen group includes halogen elements such as chlorine (Cl), fluorine (F), bromine (Br), and iodine (I). As the halosilane-based gas, it may be possible to use, for example, a precursor gas containing Si and Cl, that is, a chlorosilane-based gas. The chlorosilane-based gas acts as an Si source. As the chlorosilane-based gas, it may be possible to use, for example, a hexachlorodisilane ($Si_2Cl_6$, abbreviation: HCDS) gas. The HCDS gas refers to a gas containing an element (Si) which becomes a solid by itself under the aforementioned processing condition, that is, a gas capable of depositing a film alone under the aforementioned processing condition.

A fluorine-based gas as a cleaning gas is supplied from the gas supply pipes 232a to 232c into the process chamber 201 via the MFCs 241a to 241c, the valves 243a to 243c, the gas supply pipes 232a to 232c, and the nozzles 249a to 249c. As the fluorine-based gas, it may be possible to use, for example, a fluorine ($F_2$) gas.

A nitric oxide-based gas as an additive gas is supplied from the gas supply pipes 232a to 232c into the process chamber 201 via the MFCs 241a to 241c, the valves 243a to 243c, the gas supply pipes 232a to 232c, and the nozzles 249a to 249c. The nitric oxide-based gas does not implement a cleaning action by itself, but reacts with a fluorine-based gas to generate active species such as, for example, a halogenated nitrosyl compound or the like, and acts to improve the cleaning action of the fluorine-based gas. As the nitric oxide-based gas, it may be possible to use, for example, a nitrogen monoxide (NO) gas.

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c. The $N_2$ gas acts as a purge gas, a carrier gas, a dilution gas, or the like.

A reactant supply system is mainly configured by the gas supply pipe 232a, the MFC 241a, and the valve 243a. A precursor supply system is mainly configured by the gas supply pipe 232b, the MFC 241b, and the valve 243b. A cleaning gas supply system and an additive gas supply system are mainly configured by the gas supply pipes 232a to 232c, the MFCs 241a to 241c, and the valves 243a to 243c, respectively. An inert gas supply system is mainly configured by the gas supply pipes 232d to 232f, the MFCs 241d to 241f, and the valves 243d to 243f.

One or all of various supply systems described above may be configured as an integrated supply system 248 in which the valves 243a to 243f, the MFCs 241a to 241f, and the like are integrated. The integrated supply system 248 is connected to each of the gas supply pipes 232a to 232f so that the supply operation of various kinds of gases into the gas supply pipes 232a to 232f, that is, the opening/closing operation of the valves 243a to 243f, the flow rate adjusting operation by the MFCs 241a to 241f or the like, is controlled by a controller 121 which will be described later. The integrated supply system 248 is configured as an integral type or division type integrated unit, and is also configured so that it is detachable from the gas supply pipes 232a to 232f or the like, so as to perform the maintenance, replacement, expansion or the like of the integrated supply system 248, on an integrated unit basis.

The exhaust port 231a configured to exhaust the internal atmosphere of the process chamber 201 is installed at a lower side of the sidewall of the reaction tube 203. As illustrated in FIG. 2, the exhaust port 231a is installed at a position opposing (facing) the nozzles 249a to 249c (gas injection hole s 250a to 250c) in a plan view, with the wafers 200 interposed therebetween. The exhaust port 231a may be installed along the sidewall of the reaction tube 203 from the lower portion toward the upper portion thereof, namely along the wafer arrangement region. An exhaust pipe 231 is connected to the exhaust port 231a. A vacuum pump 246 as a vacuum exhaust device, is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that the vacuum exhaust of the interior of the process chamber 201 and the vacuum exhaust stop can be performed by opening and closing the APC valve 244 while operating the vacuum pump 246 and so that the internal pressure of the process chamber 201 can be adjusted by adjusting the opening degree of the APC valve 244 based on the pressure information detected by the pressure sensor 245 while operating the vacuum pump 246. An exhaust system is mainly configured by the exhaust pipe 231, the APC valve 244 and the pressure sensor 245. The vacuum pump 246 may be regarded as being included in the exhaust system.

Furthermore, the exhaust pipe 231 is made of an alloy having excellent heat resistance and corrosion resistance. As the alloy, it may be possible to suitably use, for example, Hastelloy (registered trademark) with enhanced heat resistance and corrosion resistance by adding iron (Fe), molybdenum (Mo), chromium (Cr) or the like to nickel (Ni), Inconel (registered trademark) with enhanced heat resistance and corrosion resistance by adding Fe, Cr, niobium (Nb), Mo or the like to Ni, or the like, in addition to stainless steel.

A seal cap 219, which serves as a furnace opening cover configured to hermetically seal a lower end opening of the manifold 209, is installed under the manifold 209. The seal cap 219 is made of a metal material such as, for example, stainless steel or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 215 is configured as a transfer device (transfer mechanism) which loads and unloads (transfers) the wafers 210 into and from the process chamber 201 by moving the seal cap 219 up and down. A shutter 219s as a furnace opening cover capable of hermetically sealing the lower end opening of the manifold 209, with the boat 217 unloaded from the interior of the process chamber 201 by moving the seal cap 219 down, is installed under the manifold 209. The shutter 219s is made of a metal material such as, for example, stainless steel or the like, and is formed in a disc shape. An O-ring 220c as a seal member making contact with the lower end portion of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as, for example, quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
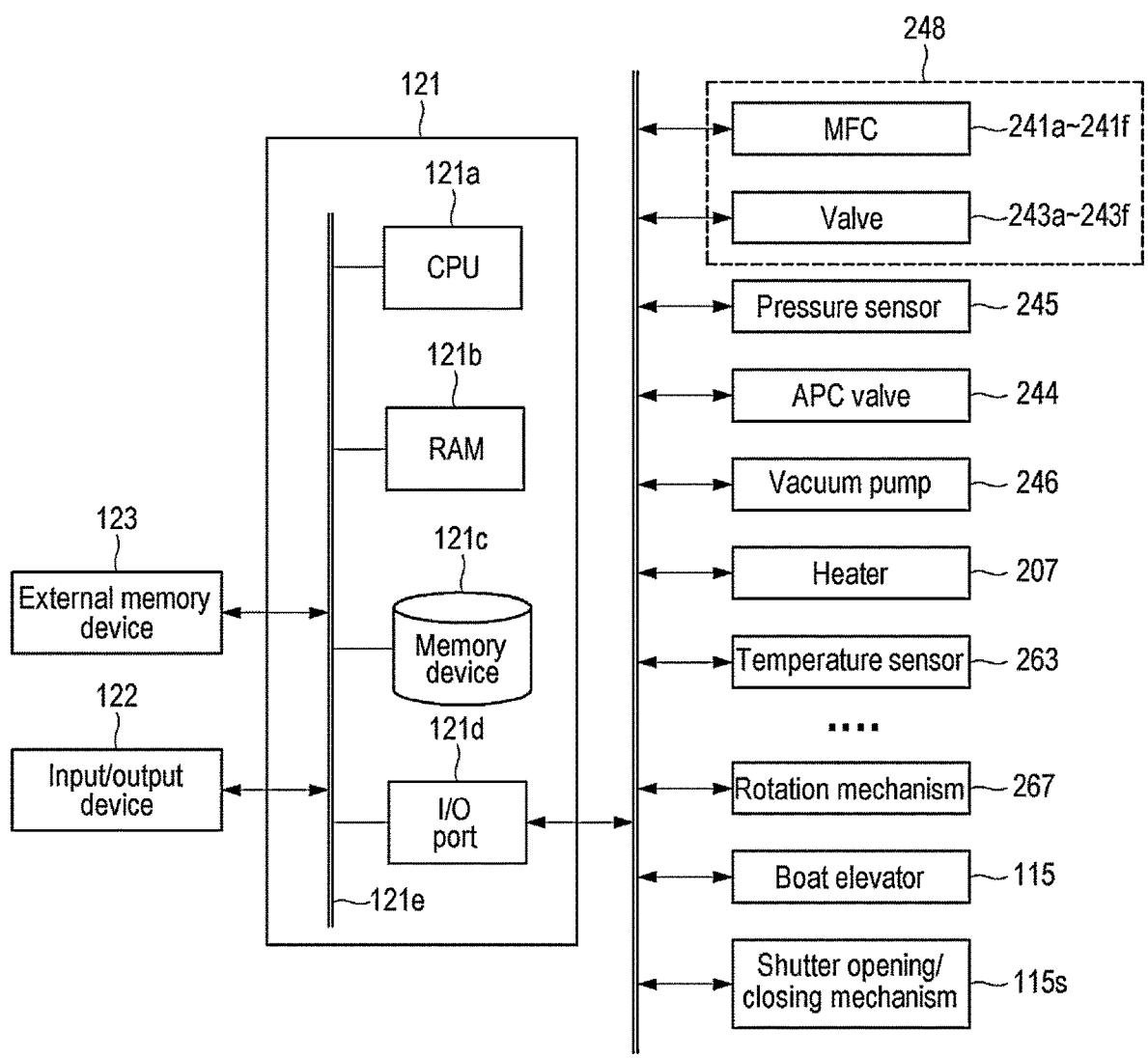
FIG. 3 is a schematic configuration diagram of a controller of the substrate processing apparatus suitably used in some embodiments of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, for example, a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of substrate processing as described hereinbelow, a cleaning recipe for specifying sequences and conditions of a cleaning process as described hereinbelow, or the like is readably stored in the memory device 121c. The process recipe functions as a program for causing the controller 121 to execute each sequence in the substrate processing, as described hereinbelow, to obtain a predetermined result. The cleaning recipe functions as a program for causing the controller 121 to execute each sequence in the cleaning process, as described hereinbelow, to obtain a predetermined result. Hereinafter, the process recipe, the cleaning recipe and the control program will be generally and simply referred to as a "program". Furthermore, the process recipe and the cleaning recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s, and the like, as mentioned above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as an MO, a semiconductor memory such as a USB memory, and the like. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing

A substrate processing sequence example of forming a film on a wafer 200 as a substrate using the aforementioned substrate processing apparatus, that is, a film-forming sequence example, which is one of the processes for manufacturing a semiconductor device, will be described. In the following descriptions, the operations of the respective parts constituting the substrate processing apparatus are controlled by the controller 121.

In the film-forming sequence of the present embodiment, a silicon nitride film (SiN film) which is a film containing Si and N, as a film on the wafer 200, is formed by performing a cycle a predetermined number of times, the cycle including non-simultaneously performing step 1 of supplying an HCDS gas as a precursor to a wafer 200 in the process container and step 2 of supplying an NH$_3$ gas as a reactant to the wafer 200 in the process container.

In the present disclosure, for the sake of convenience, the film-forming sequence described above may sometimes be denoted as follows. The same denotation will be used in the modifications and the like as described hereinbelow.

(HCDS→NH$_3$)×$n$⇒SiN

When the term "wafer" is used herein, it may refer to "a wafer itself" or "a laminated body of a wafer and a predetermined layer or film formed on the surface of the wafer". In addition, when the phrase "a surface of a wafer" is used herein, it may refer to "a surface of a wafer itself" or "a surface of a predetermined layer or the like formed on a wafer. Furthermore, in the present disclosure, the expression "a predetermined layer is formed on a wafer" may mean that "a predetermined layer is directly formed on a surface of a wafer itself" or that "a predetermined layer is formed on a layer or the like formed on a wafer. In addition, when the term "substrate" is used herein, it may be synonymous with the term "wafer."

(Wafer Charging and Boat Loading)

If a plurality of wafers 200 is charged on the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the interior of the process chamber 201 and the heating and rotation of the wafers 200 may be all continuously performed at least until the processing of the wafers 200 is completed.

(Film-Forming Step)

Next, the following steps 1 and 2 are sequentially performed.

[Step 1]

At this step, an HCDS gas is supplied to the wafer 200 accommodated in the process chamber 201 (HCDS gas supply step). Specifically, the valve 243b is opened to allow an HCDS to flow through the gas supply pipe 232b. The flow rate of the HCDS gas is adjusted by the MFC 241b. The HCDS gas is supplied into the process chamber 201 via the nozzle 249b and is exhausted from the exhaust port 231a. At this time, the HCDS gas is supplied to the wafer 200. Simultaneously, at least one of the valves 243d to 243f may be opened to supply an N$_2$ gas into the process chamber 201 via at least one of the nozzles 249a to 249c.

A processing condition at this step may be exemplified as follows:

HCDS gas supply flow rate: 0.01 to 2 slm, specifically 0.1 to 1 slm
N$_2$ gas supply flow rate (per gas supply pipe): 0 to 10 slm
Supply time of each gas: 1 to 120 seconds, specifically 1 to 60 seconds
Processing temperature: 250 to 800 degrees C., specifically 400 to 700 degrees C.
Processing pressure: 1 to 2,666 Pa, specifically 67 to 1,333 Pa.

Furthermore, in the present disclosure, the expression of the numerical range such as "250 to 800 degrees C." may mean that the lower limit value and the upper limit value are included in the range. Therefore, for example, "250 to 800 degrees C." may mean "250 degrees C. or higher and 800 degrees C. or lower". The same applies to other numerical ranges.

By supplying the HCDS gas to the wafer 200 under the aforementioned condition, an Si-containing layer containing Cl is formed as a first layer on the outermost surface of the wafer 200. The Si-containing layer containing Cl is formed on the outermost surface of the wafer 200 by physisorption of HCDS, chemisorption of a substance (hereinafter, referred to as Si$_x$Cl$_y$) of which a portion of HCDS is decomposed, pyrolysis of HCDS, or the like. The Si-containing layer containing Cl may be an adsorption layer (a physisorption layer or a chemisorption layer) of HCDS or Si$_x$Cl$_y$, or may be an Si layer containing Cl. In the present disclosure, the Si-containing layer containing Cl will be simply referred to as an Si-containing layer.

After the first layer is formed, the valve 243b is closed to stop the supply of the HCDS gas into the process chamber 201. Then, the interior of the process chamber 201 is vacuum-exhausted and the gas or the like remaining within the process chamber 201 is removed from the interior of the process chamber 201 (purge step). At this time, the valves 243d to 243f are opened to supply an $N_2$ gas into the process chamber 201. The $N_2$ gas acts as a purge gas.

As the precursor, it may be possible to use, in addition to the HCDS gas, a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas or the like. Similar to the HCDS gas, these gases are gases capable of depositing a film alone under the aforementioned processing condition.

As the inert gas, it may be possible to use, in addition to the $N_2$ gas, a rare gas such as an Ar gas, a He gas, a Ne gas, a Xe gas or the like. This is also the same at step 2 and the cleaning process as described hereinbelow.

[Step 2]

After step 1 is completed, an $NH_3$ gas is supplied to the wafer 200 in the process chamber 201, namely the first layer formed on the wafer 200 ($NH_3$ gas supply step). Specifically, the valve 243a is opened to allow an $NH_3$ gas to flow through the gas supply pipe 232a. The flow rate of the $NH_3$ gas is adjusted by the MFC 241a. The $NH_3$ gas is supplied into the process chamber 201 via the nozzle 249a and is exhausted from the exhaust port 231a. At this time, the $NH_3$ gas is supplied to the wafer 200. Simultaneously, at least one of the valves 243d to 243f may be opened to supply an $N_2$ gas into the process chamber 201 via at least one of the nozzles 249a to 249c.

A processing condition at this step may be exemplified as follows:

$NH_3$ gas supply flow rate: 0.1 to 10 slm
$N_2$ gas supply flow rate (per gas supply pipe): 0 to 2 slm
Supply time of $NH_3$ gas: 1 to 120 seconds, specifically 1 to 60 seconds
Processing pressure: 1 to 4,000 Pa, specifically 1 to 3,000 Pa.

Other processing conditions may be similar to the processing conditions of step 1.

By supplying the $NH_3$ gas to the wafer 200 under the aforementioned condition, at least a portion of the first layer formed on the wafer 200 is nitrided (modified). By modifying the first layer, a second layer containing Si and N, that is, an SiN layer, is formed on the wafer 200. When forming the second layer, an impurity such as Cl or the like contained in the first layer constitutes a gaseous substance containing at least Cl in the course of a modification reaction of the first layer by the $NH_3$ gas, and is discharged from the interior of the process chamber 201. Thus, the second layer becomes a layer having less impurity such as Cl than that of the first layer.

After the second layer is formed, the valve 243a is closed to stop the supply of the $NH_3$ gas into the process chamber 201. Then, the gas or the like remaining within the process chamber 201 is removed from the interior of the process chamber 201 according to the same processing procedures as those of the purge step of step 1 (purge step).

As the reactant, it may be possible to use, in addition to the $NH_3$ gas, for example, a hydrogen nitride-based gas such as a diazene ($N_2H_2$) gas, a hydrazine ($N_2H_4$) gas, an $N_3H_8$ gas or the like.

[Performing a Predetermined Number of Times]

An SiN film having a predetermined composition and a predetermined thickness can be formed on the wafer 200 by performing a cycle a predetermined number of times (n times) (where n is an integer of 1 or more), the cycle including non-simultaneously, that is, non-synchronously performing steps 1 and 2 described above. The aforementioned cycle may be repeated multiple times. That is, the thickness of the second layer formed per one cycle may be smaller than a desired thickness and the aforementioned cycle may be repeated multiple times until the thickness of the SiN film formed by laminating the second layer becomes equal to the desired thickness.

(After-Purge and Atmospheric Pressure Return)

After the film-forming step is completed, an $N_2$ gas as a purge gas is supplied from the respective nozzles 249a to 249c into the process chamber 201, and is exhausted from the exhaust port 231a. Thus, the interior of the process chamber 201 is purged, and the gas or the reaction byproduct, which remains in the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c (shutter closing). The processed wafers 200 are unloaded to the outside of the reaction tube 203 and are subsequently discharged from the boat 217 (wafer discharging).

(3) Cleaning Process

When the substrate processing described above is performed, a deposit containing a thin film such as an SiN film is accumulated in the process container, for example, the inner wall of the reaction tube 203, the surfaces of the nozzles 249a to 249c, the surface of the boat 217, or the like. That is, the deposit containing the thin film adheres to the surface or the like of a member in the process chamber 201, which is heated to a film-forming temperature, and is accumulated.

In addition, a deposit containing a thin film such as an SiN film may adhere to the interiors of the nozzles 249a to 249c, which are heated to the film-forming temperature, and is accumulated. This is because, at step 1 described above, even if the $N_2$ gas is supplied from each of the nozzles 249a and 249c which do not supply the HCDS gas, a predetermined amount of HCDS gas may enter into the nozzles 249a and 249c. This is also because, at step 2 described above, even if the $N_2$ gas is supplied from each of the nozzles 249b and 249c which do not supply the $NH_3$ gas, a predetermined amount of $NH_3$ gas may enter into the nozzles 249b and 249c. In these cases, a reaction corresponding to the film-forming reaction described above may proceed in the nozzles 249a to 249c, so that a deposit containing a thin film such as an SiN film may be accumulated. In particular, the deposit is more likely to be accumulated in the nozzle 249b for supplying the HCDS gas containing Si, which is an element that becomes a solid alone, than in the nozzles 249a and 249c, and an Si-rich deposit tends to be accumulated.

In some embodiments, when the amount of deposit accumulated in the process container, that is, a thickness of an accumulated film reaches a predetermined amount (thickness) before occurrence of delamination or dropping of the deposit, the interior of the process container is cleaned. In the present disclosure, this process performed on the process container will be referred to as a cleaning process.

In the cleaning process, a cycle is performed a predetermined number of times, the cycle including:
step a of separately supplying a cleaning gas and an additive gas, respectively, from any two nozzles among the nozzles 249a to 249c that are at least three supply parts into the process container after performing the aforementioned substrate processing; and
step b of supplying the cleaning gas and the additive gas, respectively, from any two nozzle among the nozzles 249a to 249c into the process container,
wherein at least one selected from the group of the cleaning gas and the additive gas is supplied from different supply parts in the step a and the step b.

Figure 4:
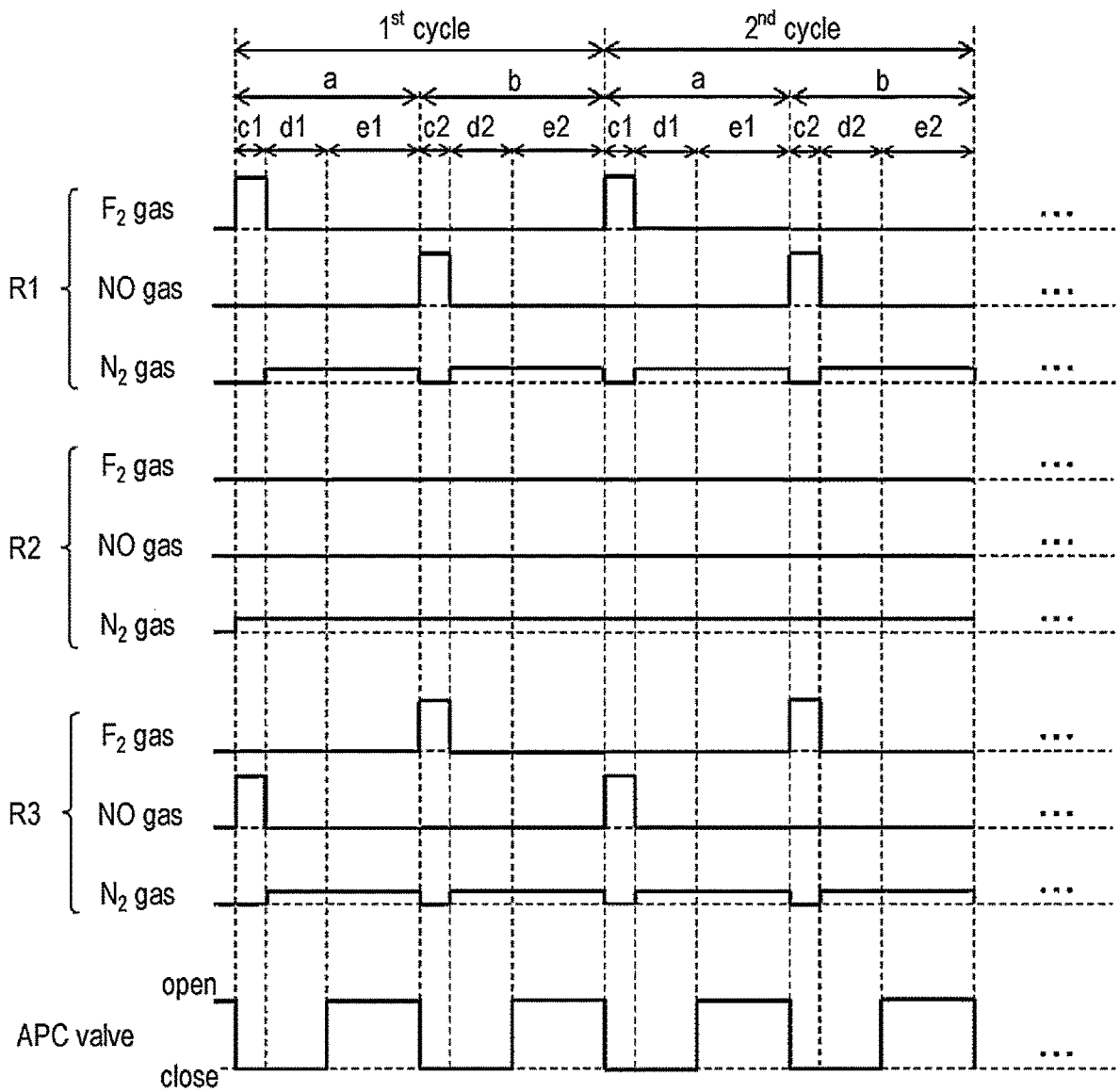
FIG. 4 is a diagram illustrating a gas supply sequence of a cleaning process according to some embodiments of the present disclosure.
Figure 5:
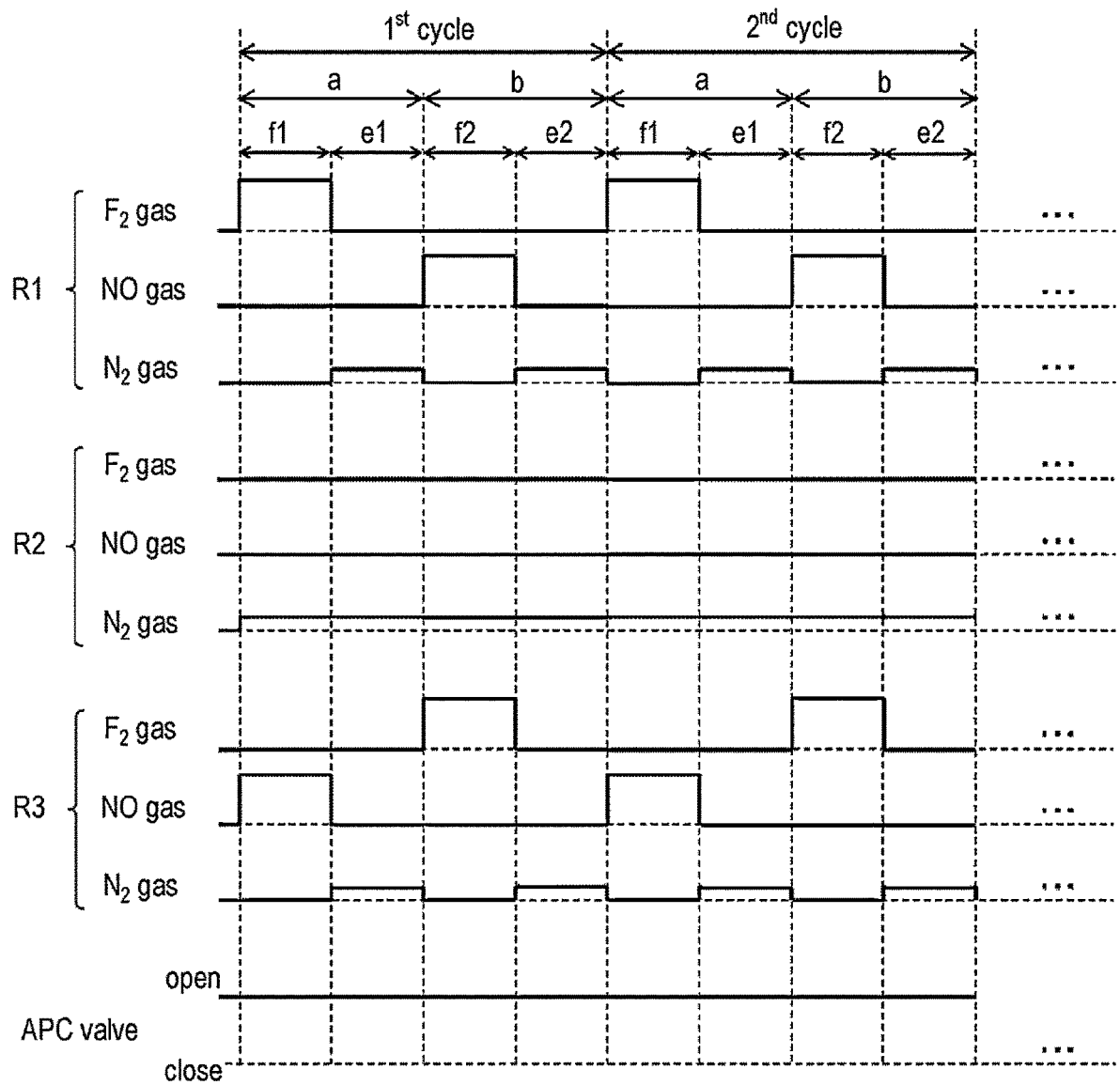
FIG. 5 is a diagram illustrating an exemplary modification of the gas supply sequence of the cleaning process according to some embodiments of the present disclosure.
Figure 6:
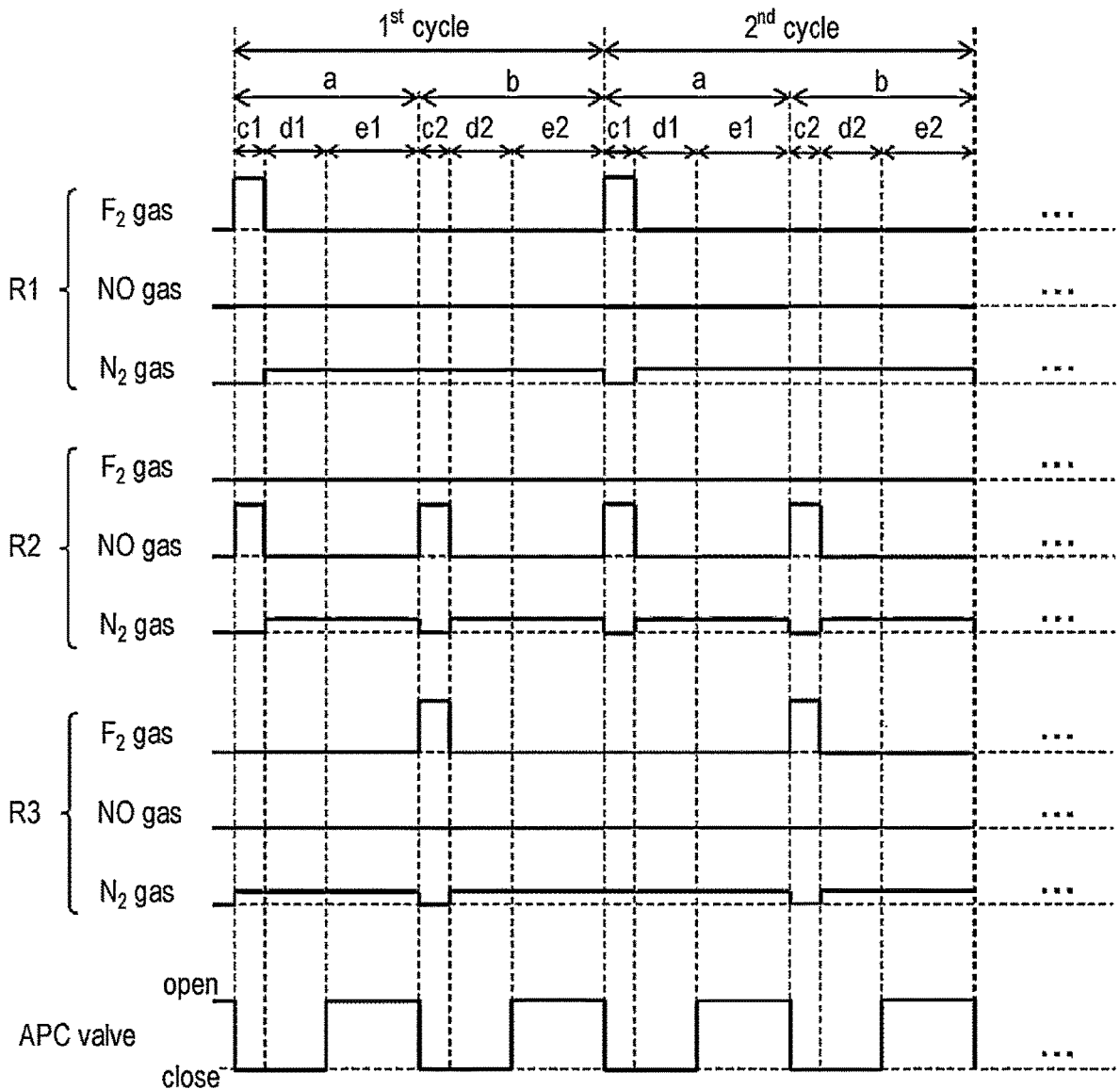
FIG. 6 is a diagram illustrating an exemplary modification of the gas supply sequence of the cleaning process according to some embodiments of the present disclosure.
Figure 7:
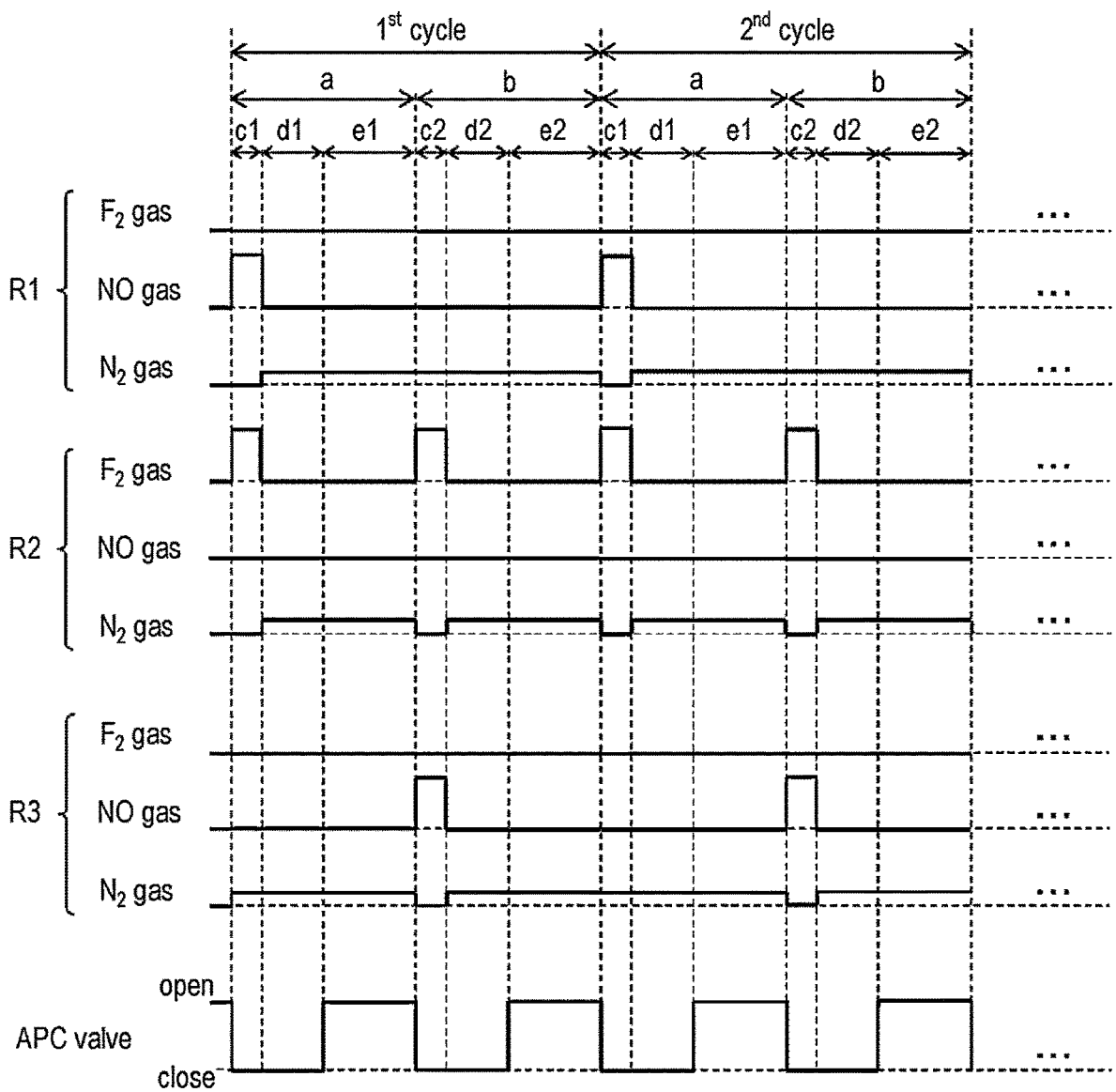
FIG. 7 is a diagram view illustrating an exemplary modification of the gas supply sequence of the cleaning process according to some embodiments of the present disclosure.

Hereinafter, an example of the cleaning process using an $F_2$ gas as the cleaning gas and an NO gas as the additive gas will be mainly described with reference to FIG. 4. In FIG. 4, the execution periods of steps a and b are denoted as a and b, respectively. Furthermore, the execution periods of steps c1, d1, e1, c2, d2, and e2, which will be described later during the execution periods of steps a and b, are denoted as c1, d1, e1, c2, d2, and e2, respectively. In addition, for the sake of convenience, the nozzles 249a to 249c are denoted as R1 to R3. These points are also the same in FIGS. 5 to 7 illustrating gas supply sequences of the respective modifications as described hereinbelow.

As illustrated in FIG. 4, in the cleaning process of some embodiments, the nozzle for supplying the $F_2$ gas at step b is set different from that used at step a. Furthermore, the nozzle for supplying the NO gas at step b is set different from that used at step a. That is, the nozzle for supplying the $F_2$ gas and the nozzle for supplying the NO gas at step b are set different from those used at step a, respectively.

Specifically, at step a, the $F_2$ gas is supplied from the nozzle 249a and the NO gas is supplied from the nozzle 249c, separately into the process container. At this time, the supply of the $F_2$ gas and the NO gas from the nozzle 249b, which is used for supplying the HCDS gas at the film-forming step described above, is not performed. Furthermore, at step b, the $F_2$ gas is supplied from the nozzle 249c and the NO gas is supplied from the nozzle 249a, separately into the process container. At this time, the supply of the $F_2$ gas and the NO gas from the nozzle 249b, which is used for supplying the HCDS gas at the film-forming step described above, is not performed.

In the following descriptions, the operations of the respective parts constituting the substrate processing apparatus are controlled by the controller 121.

(Boat Loading)

The shutter 219s is moved by the shutter opening/closing mechanism 115s to open the lower end opening of the manifold 209 (shutter opening). Thereafter, the empty boat 217, that is, the boat 217 not charged with the wafers 200, is lifted up by the boat elevator 115 and is loaded into the process chamber 201. In this state, the seal cap 219 seals the lower end of the manifold 209 through the O-ring 220b.

(Pressure Regulation and Temperature Adjustment)

The interior of the process chamber 201 is vacuum-exhausted by the vacuum pump 246 so as to reach a desired pressure (degree of vacuum). Furthermore, the interior of the process chamber 201 is heated by the heater 207 to a desired temperature. At this time, a member in the process chamber 201, that is, the inner wall of the reaction tube 203, the surfaces or the interior (inner walls) of the nozzles 249a to 249c, the surface of the boat 217, or the like, is also heated to a desired temperature. When the internal temperature of the process chamber 201 reaches a desired temperature, the temperature is controlled to be maintained until a cleaning step as described hereinbelow is completed. Subsequently, the rotation of the boat 217 by the rotation mechanism 267 begins. The rotation of the boat 217 may be continuously performed until the cleaning step as described hereinbelow is completed. The boat 217 may not be rotated.

(Cleaning Step)

Next, the following steps a and b are sequentially performed.

[Step a]

First, step a starts. At this step, first, an $F_2$ gas and an NO gas are separately supplied into the process container in a state where the exhaust of the interior of the process container is stopped, namely in a state where the exhaust system is closed (step c1). Specifically, the APC valve 244 is fully closed, and the exhaust of the interior of the process chamber 201 by the exhaust system is stopped. In addition, the valves 243a and 243c are opened to allow an $F_2$ gas to flow through the gas supply pipe 232a and to allow an NO gas to flow through the gas supply pipe 232c. The flow rates of the $F_2$ gas and the NO gas are adjusted by the MFCs 241a and 241c, respectively. The $F_2$ gas and the NO gas are supplied into the process chamber 201 via the nozzles 249a and 249c. Simultaneously, the valve 243e is opened to allow an $N_2$ gas to flow through the gas supply pipe 232e. The flow rate of the $N_2$ gas is adjusted by the MFC 241e. The $N_2$ gas is supplied into the process chamber 201 via the nozzle 249b.

A processing condition at step c1 may be exemplified as follows:
$F_2$ gas supply flow rate: 0.5 to 10 slm
NO gas supply flow rate: 0.5 to 5 slm
Flow rate ratio of NO gas/$F_2$ gas: 0.5 to 2
$N_2$ gas supply flow rate: 0.01 to 0.5 slm, specifically 0.01 to 0.1 slm
Supply time of each gas: 1 to 100 seconds, specifically 5 to 60 seconds
Processing temperature: lower than 400 degrees C., specifically 200 to 350 degrees C.

By supplying the $F_2$ gas, the NO gas or the like into the process chamber 201 in a state where the exhaust system is closed, the internal pressure of the process chamber 201 starts to rise. The internal pressure (reaching pressure) of the process chamber 201, which finally reaches by continuing the gas supply, may be set at a pressure which falls within a range of, for example, 1,330 to 53,320 Pa, specifically 9,000 to 15,000 Pa.

When the internal pressure of the process chamber 201 rises to a predetermined pressure, the supply of the $F_2$ gas and the NO gas into the process container is stopped in a state where the exhaust of the interior of the process container is stopped, and the state in which the $F_2$ gas and the NO gas are confined in the process container is maintained (step d1). Specifically, in a state in which the APC valve 244 is fully closed, the valves 243a and 243c are closed to stop the supply of the $F_2$ gas and the NO gas into the process chamber 201, and this state is maintained for a predetermined time. Simultaneously, the valves 243d to 243f are opened to supply an $N_2$ gas into the gas supply pipes 232d to 232f. The flow rate of the $N_2$ gas is adjusted by the MFCs 241d to 241f. The $N_2$ gas is supplied into the process chamber 201 via the nozzles 249a to 249c. The flow rates of the $N_2$ gas supplied from the nozzles 249a to 249c may be set at, for example, an equal flow rate.

A processing condition at step d1 may be exemplified as follows:

$N_2$ gas supply flow rate (per gas supply pipe): 0.01 to 0.5 slm, specifically 0.01 to 0.1 slm Confinement time: 10 to 200 seconds, specifically 50 to 120 seconds.

Other processing conditions may be similar to the processing conditions of step c1 except that the internal pressure of the process chamber 201 continues to rise slightly by the supply of the $N_2$ gas into the process chamber 201.

By performing steps c1 and d1, it is possible to mix the $F_2$ gas and the NO gas to react in the process chamber 201. By this reaction, active species such as, for example, nitrosyl fluoride (FNO) or the like, may be generated in the process chamber 201. As a result, there is a mixed gas obtained by adding FNO or the like to the $F_2$ gas in the process chamber 201. The mixed gas obtained by adding FNO or the like to the $F_2$ gas comes into contact with a member in the process chamber 20 1, for example, the inner wall of the reaction tube 203, the surfaces of the nozzles 249a to 249c, the surface of the boat 217, or the like. At this time, the deposit adhered to the member in the process chamber 201 can be removed by a thermochemical reaction (etching reaction). The FNO acts to promote the etching reaction with the $F_2$ gas to increase the etching rate of the deposit, that is, to assist the etching. This also applies to each etching reaction proceeding in the nozzles 249a to 249c as described hereinbelow and each etching reaction to proceed at step b as described hereinbelow.

Furthermore, during the execution period of step c1, the flow of the $F_2$ gas injected from the gas injection hole 250a and the flow of the NO gas injected from the gas injection hole 250c are each formed. During the execution period of step c1, in a member near the nozzle 249a, that is, in a member where the main flow of the $F_2$ gas reaches (a member exposed to the main flow of the $F_2$ gas), the removal of the deposit proceeds at a higher rate than in another member, that is, a member where the main flow of the $F_2$ gas does not reach (a member not exposed to the main flow of the $F_2$ gas).

On the other hand, during the execution period of step d1, each of the flows of the $F_2$ gas and the NO gas formed in the process chamber 201 at step c1 disappears and the $F_2$ gas and the NO gas are uniformly diffused in the process chamber 201. Therefore, during the execution period of step d1, the removal of the deposit proceeds at a substantially uniform rate over the interior of the process chamber 201.

In addition, at steps c1 and d1, the $F_2$ gas and the NO gas supplied into the process chamber 201 and confined therein can be diffused (reversely diffused) into at least one of the nozzles 249a to 249c.

For example, at step c1, the flow rate of the $N_2$ gas supplied from the nozzle 249b may be set smaller than the flow rate of the $F_2$ gas supplied from the nozzle 249a and the flow rate of the NO gas supplied from the nozzle 249c, without supplying the $F_2$ gas and the NO gas from the nozzle 249b. Thus, at step c1, each of the $F_2$ gas and the NO gas supplied into the process chamber 201 is allowed to enter into the nozzle 249b from the gas injection hole 250b of the nozzle 249b which does not supply the $F_2$ gas and the NO gas. The $F_2$ gas and the NO gas are mixed and reacted to generate active species such as FNO in the nozzle 249b. The active species such as FNO generated in the process chamber 201 may enter the nozzle 249b. As a result, there is a mixed gas obtained by adding FNO or the like to the $F_2$ gas in the nozzle 249b. The deposit adhered to the inner wall of the nozzle 249b is removed by the etching reaction by the mixed gas obtained by adding FNO or the like to the $F_2$ gas. Furthermore, at step c1, the $F_2$ gas is supplied from the nozzle 249a and the NO gas is supplied from the nozzle 249c at the relatively high flow rates described above. Therefore, during the execution period of step c1, it is difficult for the entering of the NO gas or the like into the nozzle 249a or the entering of the $F_2$ gas or the like into the nozzle 249c to occur. During the execution period of step c1, the active species such as FNO or the like are difficult to generate in the nozzles 249a and 249c, making it difficult to cause the aforementioned etching assist action by FNO. Thus, during the execution period of step c1, it is possible to intensively remove the deposit only in the nozzle 249b, and to perform little or no removal of the deposit in the nozzles 249a and 249c.

Furthermore, the degree of entering, the concentration or the like of the $F_2$ gas and the NO gas in the nozzle 249b can be adjusted by adjusting the flow rate of the $N_2$ gas supplied from the nozzle 249b, thereby adjusting the cleaning range in the nozzle 249b. For example, by setting the flow rate of the $N_2$ gas supplied from the nozzle 249b to 0.01 to 0.1 slm, it is possible to sufficiently clean the entire interior of the nozzle 249b. In addition, for example, by setting the flow rate of the $N_2$ gas supplied from the nozzle 249b to 0.2 to 0.5 slm, it is possible to clean only the leading end in the nozzle 249b. Moreover, by setting the flow rate of the $N_2$ gas supplied from the nozzle 249b at a flow rate exceeding 0.5 slm, for example, 1.0 slm, it may be possible to prevent the interior of the nozzle 249b from being cleaned. The fact that the cleaning range in the nozzle 249b can be adjusted as described above is also the same at step c2 as described hereinbelow.

Furthermore, for example, at step d1, the $F_2$ gas and the NO gas confined in the process chamber 201 are allowed to enter into the nozzles 249a to 249c from the gas injection holes 250a to 250c of the respective nozzles 249a to 249c. The $F_2$ gas and NO gas are mixed and reacted to generate active species such as FNO or the like in the nozzles 249a to 249c. The active species such as FNO or the like generated in the process chamber 201 may enter the nozzles 249a to 249c. As a result, there is a mixed gas obtained by adding FNO or the like to the $F_2$ gas in the nozzles 249a to 249c. The deposits adhered to the inner walls of the nozzles 249a to 249c are each removed by the etching reaction by the mixed gas obtained by adding FNO or the like to the $F_2$ gas. When the $N_2$ gas is supplied from each of the nozzles 249a to 249c at an equal flow rate at step d1, the amount of the $F_2$ gas or the like entering the nozzles 249a to 249c is substantially equal between the nozzles. From this fact, at step d1, the removal of the deposit can proceed at a substantially uniform rate in each of the nozzles 249a to 249c.

In addition, the degree of entering, the concentration or the like of the $F_2$ gas and the NO gas in the nozzles 249a to 249c can be adjusted by adjusting the flow rate of the $N_2$ gas supplied from each of the nozzles 249a to 249c, thereby adjusting the cleaning range in the nozzles 249a to 249c. For example, by setting the flow rate of the $N_2$ gas supplied from each of the nozzles 249a to 249c to 0.01 to 0.1 slm, it is possible to sufficiently clean the entire interior of the nozzles 249a to 249c. Furthermore, for example, by setting the flow rate of the $N_2$ gas supplied from each of the nozzles 249a to 249c to 0.2 to 0.5 slm, it is possible to clean only the leading ends in the nozzles 249a to 249c. In addition, by setting the flow rate of the $N_2$ gas supplied from each of the nozzles 249a to 249c at a flow rate exceeding 0.5 slm, for example, 1.0 slm, it may be possible to prevent the interior of the nozzles 249a to 249c from being cleaned. The fact that the cleaning range in the nozzles 249a to 249c can be adjusted as described above is also the same at step d2 as described hereinbelow.

After a predetermined confinement time has elapsed, the APC valve 244 is opened to exhaust the interior of the process chamber 201 (step e1). At this time, the valves 243d to 243f are opened to supply an $N_2$ gas into the process chamber 201. The $N_2$ gas acts as a purge gas.

[Step b]

Subsequently, step b starts. At this step, first, an $F_2$ gas and an NO gas are separately supplied into the process container in a state where the exhaust of the interior of the process container is stopped by the same processing procedures as those of step c1 (step c2). At this step, a nozzle for supplying the $F_2$ gas and a nozzle for supplying the NO gas are set different from those used at step a, respectively. Specifically, the valves 243c and 243a are opened to allow the $F_2$ gas to flow through the gas supply pipe 232c and to allow the NO gas to flow through the gas supply pipe 232a in a state where the APC valve 244 is fully closed. The flow rates of the $F_2$ gas and the NO gas are adjusted by the MFCs 241c and 241a, respectively. The $F_2$ gas and the NO gas are supplied into the process chamber 201 via the nozzles 249c and 249a. Simultaneously, the valve 243e is opened to supply an $N_2$ gas into the process chamber 201 via the nozzle 249b.

When the internal pressure of the process chamber 201 rises to a predetermined pressure, the supply of the $F_2$ gas and the NO gas into the process container is stopped by the processing procedures as those of step d in a state where the exhaust of the interior of the process container is stopped, and the state where the $F_2$ gas and the NO gas are confined in the process container is maintained (step d2).

The processing conditions at steps c2 and d2 may be similar to the processing conditions used at steps c1 and d1, except for the portions to which the $F_2$ gas and the NO gas are supplied.

By performing steps c2 and d2, the $F_2$ gas and the NO gas can be mixed and reacted in the process chamber 201. By this reaction, the active species such as FNO or the like are generated in the process chamber 201. As a result, there is a mixed gas obtained by adding FNO or the like to the $F_2$ gas in the process chamber 201. The deposit adhered to a member in the process chamber 201 can be removed by the etching reaction by the mixed gas obtained by adding FNO or the like to the $F_2$ gas.

Furthermore, during the execution period of step c2, the flow of the $F_2$ gas injected from the gas injection hole 250c and the flow of NO gas injected from the gas injection hole 250a are each formed. During the execution period of step c2, in a member near the nozzle 249c, that is, in a member where the main flow of the $F_2$ gas reaches, the removal of the deposit tends to proceed at a higher rate than another member, that is, a member where the main flow of the $F_2$ gas does not reach.

On the other hand, during the execution period of step d2, each of the flows of the $F_2$ gas and the NO gas formed in the process chamber 201 at step c2 disappears and the $F_2$ gas and the NO gas are uniformly diffused in the process chamber 201. Therefore, during the execution period of step d2, the removal of the deposit goes ahead at a substantially uniform rate over the interior of the process chamber 201.

Furthermore, at steps c2 and d2, the $F_2$ gas and the NO gas supplied into the process chamber 201 and confined therein can be diffused (reversely diffused) into at least one of the nozzles 249a to 249c.

For example, at step c2, the flow rate of the $N_2$ gas supplied from the nozzle 249b may be set smaller than each of the flow rate of the $F_2$ gas supplied from the nozzle 249c and the flow rate of the NO gas supplied from the nozzle 249a, while not supplying the $F_2$ gas and the NO gas from the nozzle 249b. Thus, at step c2, the $F_2$ gas and the NO gas supplied into the process chamber 201 are allowed to enter into the nozzle 249b from the gas injection hole 250b of the nozzle 249b which does not supply the $F_2$ gas and the NO gas, or the active species such as FNO or the like generated in the process chamber 201 are allowed to enter the nozzle 249b. As a result, there is a mixed gas obtained by adding FNO or the like to the $F_2$ gas in the nozzle 249b, and as at step c1, the deposit adhered to the inner wall of the nozzle 249b is removed by the etching reaction by the mixed gas obtained by adding FNO or the like to the $F_2$ gas. Furthermore, during the execution period of step c2, it is difficult for the entering of the $F_2$ gas or the like into the nozzle 249a or the entering of the NO gas or the like into the nozzle 249c to occur. Also at step c2, as at step c1, it is possible to intensively remove the deposit only in the nozzle 249b, and to perform little or no removal of the deposit in the nozzles 249a and 249c.

In addition, for example, at step d2, the $F_2$ gas and the NO gas confined in the process chamber 201 are allowed to enter into the nozzles 249a to 249c from the gas injection holes 250a to 250c of the respective nozzles 249a to 249c, or the active species such as FNO or the like generated in the process chamber 201 are allowed to enter the nozzles 249a to 249c. As a result, there is a mixed gas obtained by adding FNO or the like to the $F_2$ gas in the nozzles 249a to 249c, and similar to step d1, the deposits adhered to the inner walls of the nozzles 249a to 249c are each removed by the etching reaction by the mixed gas obtained by adding FNO or the like to the $F_2$ gas. When the $N_2$ gas is supplied from each of the nozzles 249a to 249c at an equal flow rate at step d2, the amount of the $F_2$ gas or the like entering the nozzles 249a to 249c is substantially equal between the nozzles. From this fact, at step d2, the removal of the deposit can proceed at a substantially uniform rate in each of the nozzles 249a to 249c.

After a predetermined containment time has elapsed, the APC valve 244 is opened to exhaust the interior of the process chamber 201 (step e2). At this time, the valves 243d to 243f are opened to supply an $N_2$ gas into the process chamber 201. The $N_2$ gas acts as a purge gas.

[Performing a Predetermined Number of Times]

A cycle which includes steps a and b described above is performed a predetermined number of times (once or more). Thus, the deposit adhered to the surface of a member in the process chamber 201 and the deposit adhered to the interior of the nozzles 249a to 249c can be removed.

As the cleaning gas, it may be possible to use, in addition to the $F_2$ gas, a hydrogen fluoride (HF) gas, a chlorine fluoride ($ClF_3$) gas, a nitrogen fluoride ($NF_3$) gas, or a mixed gas thereof.

As the additive gas, it may be possible to use, in addition to the NO gas, a hydrogen ($H_2$) gas, an oxygen ($O_2$) gas, a nitrous oxide ($N_2O$) gas, an isopropyl alcohol (($CH_3$)$_2$CHOH, abbreviation: IPA) gas, a methanol ($CH_3OH$) gas, water vapor ($H_2O$ gas), or a mixed gas thereof.

In addition, when the HF gas is used as the cleaning gas and at least one of the IPA gas, the methanol gas, and the $H_2O$ gas is used as the additive gas, the aforementioned processing temperature in the cleaning process may be set at a predetermined temperature which falls within a range of, for example, 30 to 300 degrees C.

(After-Purge and Atmospheric Pressure Return)

After the cleaning in the process container is completed, the interior of the process chamber 201 is purged by the same processing procedures as those of the after-purge in the substrate processing described above (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading)

The seal cap 219 is moved down by the boat elevator 115 to open the lower end of the manifold 209. Then, the empty boat 217 is unloaded from the lower end of the manifold 209 to the outside of the reaction tube 203 (boat unloading). After these series of steps are completed, the substrate processing described above is resumed.

(3) Effects According to the Present Embodiment

According to the present embodiment, one or more effects as set forth below may be achieved.

(a) By performing the cycle including steps a and b a predetermined number of times, it is possible to improve the uniformity of the cleaning process in the process container.

The reason is as follows. That is, at step c1 of step a, the $F_2$ gas is supplied from the nozzle 249a and the NO gas is supplied from the nozzle 249c. During the execution period of step c1 of step a, in a member near the nozzle 249a, that is, in a member where the main flow of the $F_2$ gas reaches, the removal of the deposit proceeds at a higher rate than another member, that is, a member where the main flow of the $F_2$ gas does not reach. Furthermore, during the execution period of step c2 of step b, in a member near the nozzle 249c, that is, in a member where the main flow of the $F_2$ gas reaches, the removal of the deposit proceeds at a higher rate than another member, that is, a member where the main flow of the $F_2$ gas does not reach.

By alternately performing step a including step c1 and step b including step c2 a predetermined number of times as in some embodiments of the present disclosure, it is possible to clean the interior of the process container in a well-balanced manner. That is, it is possible to perform the cleaning process while alternately switching regions where the etching rate of the deposit is relatively large. This makes it possible to substantially uniformly perform the cleaning process over an entire region inside the process container. In addition, it is possible to perform the cleaning process while alternately switching members where the main flow of the $F_2$ gas reaches. This also makes it possible to reduce the local etching damage or the like of the quartz member installed in the process container. Furthermore, according to extensive research of the present inventors, it was known that the etching rate of the deposit becomes the maximum at a portion where the ratio of the flow rate of the $F_2$ gas and the flow rate of the NO gas is 2:1 (=$F_2$: NO) and thus the etching damage of the quartz member is likely to proceed.

(b) By performing steps d1 and d2 for maintaining the state in which the $F_2$ gas and the NO gas are confined in the process container after performing steps c1 and c2, it is possible to further improve the uniformity of the cleaning process in the process container. This is because the $F_2$ gas and the NO gas are diffused into the entire process chamber 201 so as to be widely diffused over the interior of the process chamber 201 by maintaining the state in which the $F_2$ gas and the NO gas are confined in the process container after performing steps c1 and c2.

Furthermore, during the execution period of steps c1 and c2, the flow of the $F_2$ gas or the like injected from the gas injection hole s 250a and 250c is formed in the process container. Therefore, not only portions where the $F_2$ gas or the like is likely to be supplied but also portions where the $F_2$ gas or the like is difficult to be supplied are generated in the process container. By performing steps d1 and d2 as in the present embodiment, the $F_2$ gas or the like is evenly diffused into the process container, and during the execution period of steps c1 and c2, the $F_2$ gas or the like can be supplied to the portions where the $F_2$ gas or the like is difficult to be supplied. That is, it is possible to reduce or remove the portions where the $F_2$ gas or the like is difficult to be supplied. This makes it possible to further improve the uniformity of the cleaning process in the process container.

(c) By performing each of steps c1, c2, d1, and d2 in a state where the exhaust system is closed, it is possible to secure a long reaction time between the $F_2$ gas and the NO gas, and to increase the production efficiency of active species such as FNO or the like. In addition, it is possible to secure a long reaction time between the mixed gas obtained by adding FNO or the like to the $F_2$ gas and the deposit. As a result, it is possible to improve the efficiency of the cleaning process.

(d) By performing each of steps c1, c2, d1, and d2 in a state where the exhaust system is closed, it is possible to reduce the amounts of the $F_2$ gas and the NO gas which are exhausted from the exhaust port 231a without contributing to the cleaning process, and to reduce the gas cost. In some embodiments of the present disclosure, it is possible to reduce the usage amounts of the $F_2$ gas and the NO gas necessary for completing the cleaning process to, for example, ⅓ or less, compared with the case where the $F_2$ gas and the NO gas are supplied into the process chamber 201 without closing the exhaust system.

(e) By performing the cleaning process by means of performing each of steps c1, c2, d1, and d2 in a state where the exhaust system is closed, it is possible to suppress an exothermic reaction occurring in the exhaust pipe 231 and to suppress the temperature rise of the exhaust pipe 231.

This is because, when the aforementioned substrate processing is performed, Cl contained in the HCDS gas flowing through the process chamber 201 or the exhaust pipe 231 and N or H contained in the $NH_3$ gas or the like flowing through the process chamber 201 or the exhaust pipe 231 may be reacted with each other, particularly at a low temperature portion, to adhere the reaction byproduct containing ammonium chloride ($NH_4Cl$) or the like to the inner wall of the exhaust pipe 231 which is the low temperature portion. When the exhaust pipe 231 is configured as a bellows pipe having an uneven structure on the inner wall, the adhesion amount of the reaction byproduct is likely to increase. When the $F_2$ gas and the NO gas are supplied into the process chamber 201 without closing the exhaust system in a state where the reaction byproduct is adhered to the inner wall of the exhaust pipe 231, the $F_2$ gas or the like introduced into the exhaust pipe 231 and the reaction byproduct described above may be reacted with each other. The temperature of the exhaust pipe 231 may rise due to reaction heat generated in this reaction. When the $F_2$ gas or the like is allowed to flow through the exhaust pipe 231 in a state where a large amount of reaction byproduct is adhered to the inner wall of the exhaust pipe 231, the temperature of the exhaust pipe 231 excessively rises and the inner wall of the exhaust pipe 231 is exposed to the $F_2$ gas or the like at a high temperature and thus the exhaust pipe 231 may be corroded.

By performing each of steps c1, c2, d1, and d2 in a state where the exhaust system is closed as in some embodiments of the present disclosure, at each of steps c1, c2, d1, and d2, it possible to prevent the $F_2$ gas or the like from being introduced into the exhaust pipe 231 and to suppress the reaction between the $F_2$ gas or the like and the aforementioned reaction byproduct. This makes it possible to suppress the generation of the aforementioned reaction heat and to prevent the temperature rise of the exhaust pipe 231.

Here, when steps e1 and e2 are performed after performing steps c1, c2, d1 and d2 as in some embodiments of the present disclosure, it may be considered that the $F_2$ gas or the like confined in the process chamber 201 is introduced into the exhaust pipe 231 at a time and reacted with the reaction byproduct to generate the reaction heat. However, the $F_2$ gas or the like confined in the process chamber 201 at steps c1, c2, d1, and d2 is reacted with the deposit in the process chamber 201 to consume most of them, which becomes a deactivated state. Furthermore, as described above, when each of steps c1, c2, d1, and d2 is performed in a state where the exhaust system is closed as in some embodiments of the present disclosure, the usage amount of the $F_2$ gas or the like can be greatly reduced and the absolute amount of the $F_2$ gas or the like flowing through the exhaust pipe 231 can be reduced, compared with the case where the $F_2$ gas or the like is supplied into the process chamber 201 without closing the exhaust system. From these facts, even if steps e1 and e2 are performed after performing steps c1, c2, d1 and d2, the reaction between the $F_2$ gas or the like and the reaction byproduct does not proceed excessively in the exhaust pipe 231 and thus the temperature rise of the exhaust pipe 231 becomes very gentle.

As described above, according to the present embodiment, it is possible to suppress the temperature rise of the exhaust pipe 231 or to drop the temperature of the exhaust pipe 231. As a result, the interior of the exhaust pipe 231 can be prevented from being exposed to the $F_2$ gas or the like at a high temperature to suppress the corrosion of the exhaust pipe 231.

(f) In the cleaning process, it is possible to diffuse the $F_2$ gas and the NO gas supplied into the process chamber 201 into the nozzles 249a to 249c at each of steps a and b. This makes it possible to remove the deposits adhered to the inner walls of the nozzles 249a to 249c.

For example, at step c1 and c2, the $F_2$ gas and the NO gas supplied into the process chamber 201 are allowed to enter into the nozzle 249b from the gas injection hole 250b of the nozzle 249b which does not supply the $F_2$ gas and the NO gas. As described above, the deposit tends to be more easily accumulated in the nozzle 249b than in the nozzles 249a and 249c. By performing steps c1 and c2, the cleaning in the nozzle 249b in which the deposit is likely to be accumulated can be intensively performed. Furthermore, during the execution period of step c1, it is difficult for the entering of the NO gas or the like into the nozzle 249a or the entering of the $F_2$ gas or the like into the nozzle 249c to occur. In addition, during the execution period of step c2, it is difficult for the entering of the $F_2$ gas or the like into the nozzle 249a or the entering of the NO gas or the like into the nozzle 249c to occur. From these facts, at steps c1 and c2, the cleaning process in the nozzles 249a and 249c is more difficult to proceed than in the nozzle 249b.

Furthermore, for example, at steps d1 and d2, the $F_2$ gas and the NO gas confined in the process chamber 201 are allowed to enter into the nozzles 249a to 249c from the gas injection holes 250a to 250c of the respective nozzles 249a to 249c. When the $N_2$ gas is supplied from each of the nozzles 249a to 249c at an equal flow rate at steps d1 and d2 as in some embodiments of the present disclosure, the amount of the $F_2$ gas or the like entering the nozzles 249a to 249c may be set at a substantially equal amount between the nozzles. As a result, the cleaning process can proceed with a substantially uniform degree in each of the nozzles 249a to 249c.

As described above, in the cleaning process of some embodiments of the present disclosure, it is possible to remove the deposits adhered to the inner walls of the nozzles 249a to 249c. In addition, by performing steps c1 and c2 for intensively cleaning the interior of the nozzle 249b and steps d1 and d2 for cleaning the interior of the nozzles 249a to 249c with a substantially uniform degree in combination, it is possible to individually adjust the degree of etching process according to the amount of the deposits adhered to the interior of the nozzles 249a to 249c. This makes it possible to reliably clean the interior of each of the nozzles 249a to 249c while suppressing over-etching of the inner walls of the nozzles 249a to 249c.

(g) According to some embodiments of the present disclosure, it is possible to simultaneously perform the cleaning process in the process chamber 201 and the cleaning process in the nozzles 249a to 249c under the same temperature condition. That is, as in the case where the cleaning process in the process chamber 201 and the cleaning process in the nozzles 249a to 249c are separately performed under different temperature conditions, it is unnecessary to prepare respective cleaning process times and is not also necessary to prepare a standby time for changing the processing temperatures between them. Thus, according to some embodiments of the present disclosure, it is possible to drastically reduce the time required for the cleaning process, compared with the case where the temperature conditions of the cleaning process in the process chamber 201 and the cleaning process in the nozzles 249a to 249c are set different from each other.

(h) According to some embodiments of the present disclosure, by supplying the $N_2$ gas from the nozzle 249b at steps c1 and c2 and supplying the $N_2$ gas from the nozzles 249a to 249c at steps d1 and d2, it is possible to suppress excessive reverse diffusion of the $F_2$ gas and the NO gas into the nozzles 249a to 249c. This makes it possible to protect the integrated supply system 248 and to avoid its failure.

(i) The effects mentioned above can be similarly achieved in the case where a cleaning gas other than the $F_2$ gas is used, or in the case where an additive gas other than the NO gas is used, or in the case where an inert gas other than the $N_2$ gas is used, in the cleaning process. In addition, the aforementioned effects can be similarly achieved in the case where a precursor other than HCDS gas is used, or in the case where a reactant other than the $NH_3$ gas is used, or in the case where an inert gas other than the $N_2$ gas is used, in the substrate processing.

(4) Exemplary Modifications

The cleaning process of the present embodiment is not limited to the one illustrated in FIG. 4 but may be modified as in the modifications described below. These modifications may be arbitrarily combined. Unless otherwise specified, the processing procedure and the processing condition of each step of the respective modifications may be similar to the processing procedure and processing condition of each step of the cleaning process illustrated in FIG. 4.

(Modification 1)

As illustrated in FIG. 5, at steps a and b, steps f1 and f2 of supplying the $F_2$ gas and the NO gas into the process container and steps e1 and e2 of exhausting (purging) the interior of the process container may be performed in a state where the interior of the process container is exhausted, that is, in a state where the exhaust system is opened. In FIG. 5, the execution periods of steps f1 and f2 are denoted as f1 and f2, respectively. The processing procedures and processing conditions of steps f1 and f2 may be similar to the processing procedures and processing conditions of steps c1 and c2, except that the APC valve 244 is not fully closed but opened and the conditions changed accordingly.

Furthermore, steps f1 and e1 may be performed at step a and steps c2, d2, and e2 described above may be performed at step b. In addition, steps c1, d1, and e1 described above may be performed at step a and steps f2 and e2 may be performed at step b. Also, as illustrated in FIG. 5, steps f1 and e1 may be performed at step a and steps f2 and e2 may be performed at step b. That is, the confinement of the $F_2$ gas and the NO gas into the process container may not be performed at either one of steps a and b, or may not be performed at both steps a and b as illustrated in FIG. 5.

Even in this modification, substantially the same effects as those of the cleaning process illustrated in FIG. 4 may be achieved. However, it is desirable that the cleaning process illustrated in FIG. 4 can more uniformly diffuse the $F_2$ gas or the like into the process container and can more improve the uniformity of the cleaning process, than the cleaning process of this modification. In addition, it is desirable that the cleaning process illustrated in FIG. 4 can more reduce the gas cost than the cleaning process of this modification. Furthermore, it is desirable that the cleaning process illustrated in FIG. 4 can more suppress the temperature rise of the exhaust pipe 231 than the cleaning process of this modification.

(Modification 2)

As illustrated in FIG. 6, at steps a and b, the supply of the $F_2$ gas into the process chamber 201 may be performed from the nozzles 249a and 249c while alternately switching them, and the supply of the NO gas into the process chamber 201 may be performed without switching from the nozzle 249b to any other nozzle.

Specifically, at step c1 of step a, the $F_2$ gas is supplied from the nozzle 249a and the NO gas is supplied from the nozzle 249b, into the process container at a flow rate equal to the flow rates of the $F_2$ gas and the NO gas at step c1 of the cleaning process illustrated in FIG. 4. At this time, the $N_2$ gas is supplied from the nozzle 249c at a flow rate of, for example, 0.01 to 0.5 slm, specifically 0.01 to 0.1 slm. Furthermore, at step c2 of step b, the $F_2$ gas is supplied from the nozzle 249c and the NO gas is supplied from the nozzle 249b, into the process container at a flow rate equal to the flow rates of the $F_2$ gas and the NO gas at step c1 of the cleaning process illustrated in FIG. 4. At this time, the $N_2$ gas is supplied from the nozzle 249a at a flow rate of, for example, 0.01 to 0.5 slm, specifically, 0.01 to 0.1 slm. As described above, only one of the nozzle for supplying the $F_2$ gas and the nozzle for supplying the NO gas at step b (here, only the nozzle for supplying the $F_2$ gas) may be set different from that at step a.

Even in this modification, substantially the same effects as those of the cleaning process illustrated in FIG. 4 may be achieved. However, it is desirable that the cleaning process illustrated in FIG. 4 can further improve the uniformity of the cleaning in the process container, compared with this modification.

Moreover, in this modification, at steps c1 and c2, the nozzle which does not supply the $F_2$ gas and the NO gas is changed and the nozzle which allows the $F_2$ gas and the NO gas to enter is changed. Specifically, at step c1, the $F_2$ gas and the NO gas are allowed to enter the nozzle 249c, and at step c2, the $F_2$ gas and the NO gas are allowed to enter the nozzle 249a. In this modification, by alternately performing step a including step c1 and step b including step c2 a predetermined number of times, it is possible to evenly clean the interior of the two nozzles 249c and 249a. In this modification, in the case where the substrate processing is performed by such a processing procedure that the deposit is more likely to be deposited in the nozzles 249a and 249c than in the nozzles 249b, it is effective particularly in forming an SiN film on the wafer 200, for example, by supplying the HCDS gas from the nozzles 249a and 249c at step 1 of the film-forming step and supplying the $NH_3$ gas from the nozzle 249b at step 2 thereof.

(Modification 3)

As illustrated in FIG. 7, at steps a and b, the supply of the $F_2$ gas into the process chamber 201 may be performed without switching from the nozzle 249b to any other nozzle, and the supply of the NO gas into the process chamber 201 may be performed from the nozzles 249a and 249c while alternately switching them.

Specifically, at step c1 of step a, the $F_2$ gas is supplied from the nozzle 249b and the NO gas is supplied from the nozzle 249a, into the process container at a flow rate equal to the flow rates of the $F_2$ gas and the NO gas at step c1 of the cleaning process illustrated in FIG. 4. At this time, the $N_2$ gas is supplied from the nozzle 249c at a flow rate of, for example, 0.01 to 0.5 slm, specifically, 0.01 to 0.1 slm. Furthermore, at step c2 of step b, the $F_2$ gas is supplied from the nozzle 249b and the NO gas is supplied from the nozzle 249c, into the process container at a flow rate equal to the flow rates of the $F_2$ gas and the NO gas at step c1 of the cleaning process illustrated in FIG. 4. At this time, the $N_2$ gas is supplied from the nozzle 249a at a flow rate of, for example, 0.01 to 0.5 slm, specifically, 0.01 to 0.1 slm. As described above, only one of the nozzle for supplying the $F_2$ gas and the nozzle for supplying the NO gas at step b (here, only the nozzle for supplying the NO gas) may be set different from that at step a.

Even in this modification, substantially the same effects as those of the cleaning process illustrated in FIG. 4 may be achieved. However, it is desirable that the cleaning process illustrated in FIG. 4 and modification 2 described above can further improve the uniformity of the cleaning in the process container, compared with this modification.

Moreover, in this modification, as in modification 2, at steps c1 and c2, the nozzle which does not supply the $F_2$ gas and the NO gas is changed and the nozzle which allows the $F_2$ gas and the NO gas to enter is changed. Specifically, at step c1, the $F_2$ gas and the NO gas are allowed to enter the nozzle 249c, and at step c2, the $F_2$ gas and THE NO gas are allowed to enter the nozzle 249a. In this modification, by alternately performing step a including step c1 and step b including step c2 a predetermined number of times, it is possible to evenly clean the interior of the two nozzles 249c and 249a. In this modification, in the case where the substrate processing is performed by such a processing procedure that the deposit is more likely to be deposited in the nozzles 249a and 249c than in the nozzles 249b, it is effective particularly in forming an SiN film on the wafer 200, for example, by supplying the HCDS gas from the nozzles 249a and 249c at step 1 of the film-forming step and supplying the $NH_3$ gas from the nozzle 249b at step 2 thereof.

(Modification 4)

A cycle including the cleaning process (cleaning process A) illustrated in FIG. 4, the cleaning process (cleaning process B) illustrated in FIG. 6, and the cleaning process (cleaning process C) illustrated in FIG. 7 is set as one cycle, and this cycle may be performed a predetermined number of times.

Even in this modification, substantially the same effects as those of the cleaning process illustrated in FIG. 4 and modifications 2 and 3 may be achieved. Furthermore, in the cleaning process A, as described above, the cleaning process in the nozzle 249b tends to more easily proceed than the cleaning process in the nozzles 249a and 249c. In addition, in the cleaning processes B and C, as described above, the cleaning process in the nozzles 249a and 249c tends to proceed more easily than the cleaning process in the nozzle 249b. Therefore, in this modification, when the cleaning process in the nozzle 249b is desired to be more preferentially performed than in the nozzles 249a and 249c, it is desirable that the total execution period of steps c1 and c2 in the cleaning process A (the total time at which the $F_2$ gas or the like is reversely diffused into the nozzle 249b) be set longer than the total execution period of steps c1 and c2 in the cleaning processes B and C (the total time at which the $F_2$ gas or the like is reversely diffused into the nozzles 249a and 249c).

(Modification 5)

At at least one of steps c1, d1, c2, and d2, the supply of the $N_2$ gas from the nozzles 249a to 249c may not be performed.

For example, at steps c1 and c2, the supply of the $N_2$ gas from the nozzle 249b may not be performed. Even in this case, substantially the same effects as those of the cleaning process illustrated in FIG. 4 may be achieved. In addition, in this case, it is possible to further urge the entering of the $F_2$ gas and the NO gas into the nozzle 249b at steps c1 and c2, compared with the cleaning process illustrated in FIG. 4. As a result, it possible to further promote the intensive cleaning in the nozzle 249b.

Furthermore, at this time, by supplying a small amount of NO gas from the nozzle 249b, the $F_2$ gas or the like is allowed to enter the nozzle 249b in an NO gas atmosphere. Thus, it is possible to further promote the intensive cleaning in the nozzle 249b. It is desirable that the flow rate of the NO gas supplied from the nozzle 249b be set to a level that allows the entering of the $F_2$ gas or the like into the nozzle 249b, for example, about 0.01 to 0.1 slm. In addition, at this time, even when a small amount of $F_2$ gas is supplied instead of supplying a small amount of NO gas from the nozzle 249b, the same effects as described above may be achieved.

Furthermore, for example, at steps d1 and d2, the supply of the $N_2$ gas from the nozzles 249a to 249c may not be performed. Even in this case, substantially the same effects as those of the cleaning process illustrated in FIG. 4 may be achieved. In addition, in this case, it is possible to further urge the entering of the $F_2$ gas and the NO gas into the nozzles 249a to 249c at steps d1 and d2, compared with the cleaning process illustrated in FIG. 4. As a result, it is possible to more efficiently clean the interior of the nozzles 249a to 249c.

Also, at this time, by supplying a small amount of NO gas from each of the nozzles 249a to 249c, the $F_2$ gas or the like is allowed to enter the nozzles 249a to 249c in an NO gas atmosphere, and the interior of the nozzles 249a to 249c can be more efficiently cleaned. It is desirable that the flow rate of the NO gas supplied from each of the nozzles 249a to 249c be set to a level that allows the entering of the $F_2$ gas or the like into the nozzles 249a to 249c, for example, about 0.01 to 0.1 slm. In addition, at this time, even when a small amount of $F_2$ gas is supplied instead of supplying a small amount of NO gas from each of the nozzles 249a to 249c, the same effects as described above may be achieved.

Furthermore, for example, at steps d1 and d2, the supply of the $N_2$ gas from the nozzles 249a and 249c may be performed while not supplying the $N_2$ gas from the nozzle 249b. Even in this case, substantially the same effects as those of the cleaning process illustrated in FIG. 4 may be achieved. In addition, in this case, it is possible to suppress the entering of the $F_2$ gas and the NO gas into the nozzles 249a and 249c while further urging the entering of the $F_2$ gas and the NO gas into the nozzle 249b at step d1 and d2. As a result, it is possible to further promote the intensive cleaning in the nozzle 249b, compared with the cleaning process illustrated in FIG. 4. In addition, it is possible to appropriately suppress over-etching of the inner walls of the nozzles 249a and 249c.

Furthermore, at this time, as described above, by supplying a small amount of NO gas or $F_2$ gas from the nozzle 249b, it is possible to further promote the intensive cleaning in the nozzle 249b for the same reason as described above.

(Modification 6)

At at least one of steps d1 and d2, the flow rates of the $N_2$ gas supplied from the nozzles 249a to 249c may be set different from each other. For example, at steps d1 and d2, the flow rate of the $N_2$ gas supplied from the nozzle 249b may be set larger than the flow rate of the $N_2$ gas supplied from the nozzles 249a and 249c. Even in this case, substantially the same effects as those of the cleaning process illustrated in FIG. 4 may be achieved. Furthermore, in this case, at steps d1 and d2, it is possible to urge the entering of the $F_2$ gas and the NO gas into the nozzles 249a and 249c while suppressing the entering of the $F_2$ gas and the NO gas into the nozzle 249b. As a result, it is possible to suppress the cleaning in the nozzle 249b and to appropriately suppress over-etching of the inner wall of the nozzle 249b, compared with the cleaning process illustrated in FIG. 4.

(Modification 7)

When a cycle including steps a and b is performed a predetermined number of times, at least one of steps e1 and e2 may not be performed. For example, in the cleaning process illustrated in FIG. 4, the purging (steps e1 and e2) in the process container is not performed in at least any one selected from the group of a period between steps d1 and c2 a period between steps d2 and c1, and the cycle including steps a and b may be performed a predetermined number of times. In addition, for example, in the cleaning process illustrated in FIG. 5, the purging (steps e1 and e2) in the process container is not performed in at least any one selected from the group of a period between steps f1 and f2 and a period between steps f2 and f1, and the cycle including steps a and b may be performed a predetermined number of times. Even in this modification, substantially the same effects as those of the cleaning process illustrated in FIG. 4 may be achieved. Furthermore, in this modification, it is possible to urge the mixing of the $F_2$ gas and the NO gas in the nozzles 249a and 249c. As a result, it is possible to further promote the cleaning in the nozzles 249a and 249c, compared with the cleaning processes illustrated in FIGS. 4 and 5.

(Modification 8)

The aforementioned cycle performed in the cleaning process may include the following cycles A and B.

Steps a and b in cycle A may be performed in the same manner as steps a and b of the cleaning process illustrated in FIG. 4. That is, at steps a and b in cycle A, there may be performed: steps c1 and c2 of supplying an $F_2$ gas and an NO gas into the process container in a state where the exhaust of the interior of the process container is stopped; steps d1 and d2 of stopping the supply of the $F_2$ gas and the NO gas into the process container and maintaining a state where the $F_2$ gas and the NO gas are confined in the process container in a state where the exhaust of the interior of the process container is stopped; and steps e1 and e2 of exhausting the interior of the process container.

Steps a and b in cycle B may be performed in the same manner as steps a and b of the cleaning process illustrated in FIG. 5. That is, at steps a and b in cycle B, there may be performed: steps f1 and f2 of supplying an $F_2$ gas and an NO gas into the process container in a state where the interior of the process container is exhausted; and steps e1 and e2 of exhausting (purging) the interior of the process container.

As described above, the cycle including cycle A which performs confinement of the $F_2$ gas and the NO gas in the process container, and cycle B which does not perform confinement of the $F_2$ gas and the NO gas in the process container may be performed a predetermined number of times. That is, the cycle including the cycle of the cleaning process (cycle A) illustrated in FIG. 4 and the cycle of the cleaning process (cycle B) illustrated in FIG. 5 may be performed a predetermined number of times.

Even in this modification, substantially the same effects as those of the cleaning process illustrated in FIG. 4 and modification 1 may be achieved. Furthermore, in this modification, it is desirable that the $F_2$ gas or the like is more uniformly diffused into the process container than in modification 1 and thus the uniformity of the cleaning process can be improved. Moreover, in this modification, it is desirable that the temperature rise of the exhaust pipe 231 can be more suppressed than in modification 1. In addition, in this modification, it is desirable that the usage amount of $F_2$ gas or the like can be more reduced than in modification 1 to reduce the gas cost. Furthermore, in this modification, it is desirable that cycle A be performed before cycle B. By doing so, it is possible to make the temperature rise rate of the exhaust pipe 231 gentle, compared with the case where cycle B is performed before cycle A.

Other Embodiments

While one embodiment of the present disclosure has been specifically described above, the present disclosure is not limited to the aforementioned embodiment but may be differently modified without departing from the spirit of the present disclosure.

In the aforementioned embodiment, there has been described an example in which an SiN film is formed on the wafer in the process container and then the interior of the process container or the interior of the nozzle is cleaned. However, the present disclosure is not limited thereto. For example, the aforementioned cleaning process may be applied to a case where a silicon-based insulating film such as a silicon oxide film (SiO film), a silicon oxycarbonitride film (SiOCN film), a silicon oxycarbide film (SiOC film), a silicon oxynitride film (SiON film), a silicon carbonitride film (SiCN film), a silicon boron carbonitride film (SiBCN film), a silicon boron nitride film (SiBN film) or the like is formed on the wafer in the process container, and then the interior of the process container or the interior of the nozzle is cleaned.

Recipes used in substrate processing or cleaning process may be prepared individually according to the processing contents and may be stored in the memory device 121c via a telecommunication line or the external memory device 123. Moreover, at the start of substrate processing or cleaning process, the CPU 121a may properly select an appropriate recipe from the recipes stored in the memory device 121c according to the contents of the substrate processing or cleaning process. Thus, it is possible for a single substrate processing apparatus to form films of different kinds, composition ratios, qualities and thicknesses with enhanced reproducibility. Furthermore, an appropriate cleaning process may be performed according to deposits containing various films adhered to the interior of the process container (process chamber 201) or the interior of the supply part (nozzle). In addition, it is possible to reduce an operator's burden and to quickly start the processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

Figure 10A:
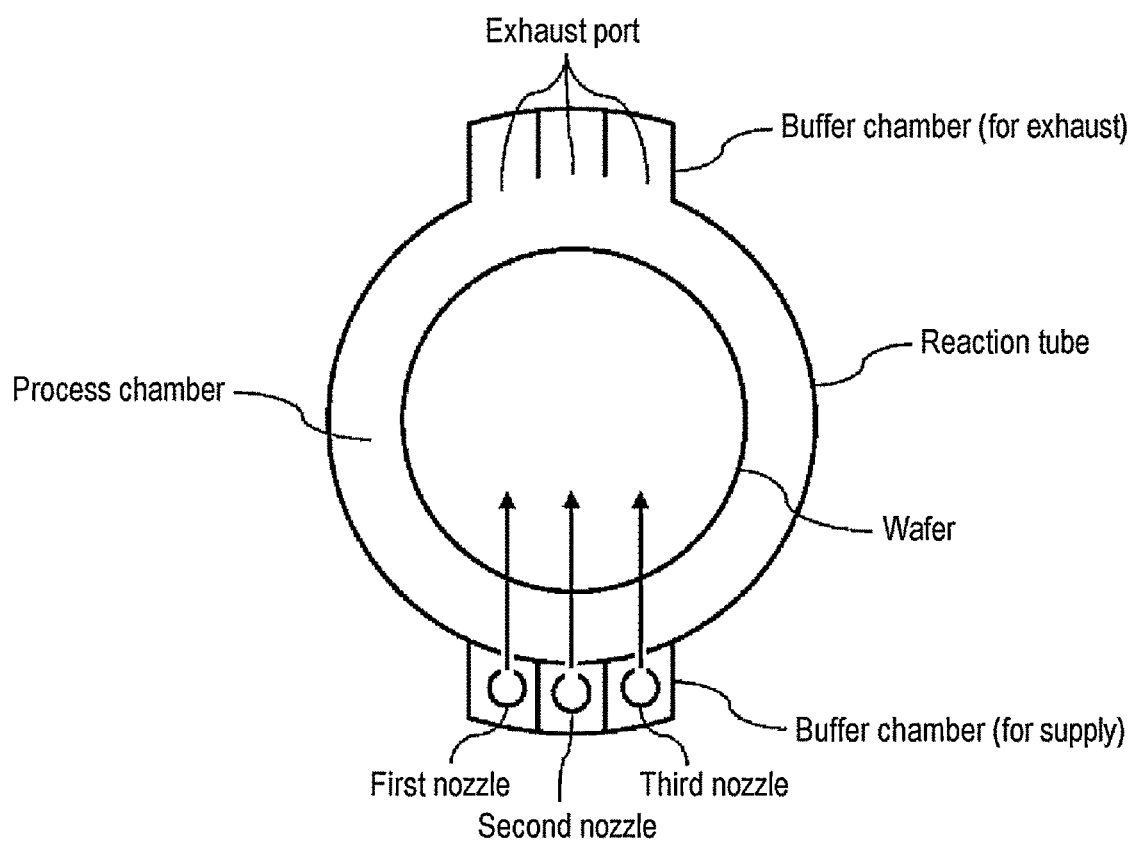
FIGS. 10A and 10B are cross sectional views illustrating exemplary modifications of the vertical process furnace, in which a reaction tube, buffer chambers, nozzles, and the like are partially extracted and shown.
Figure 10B:
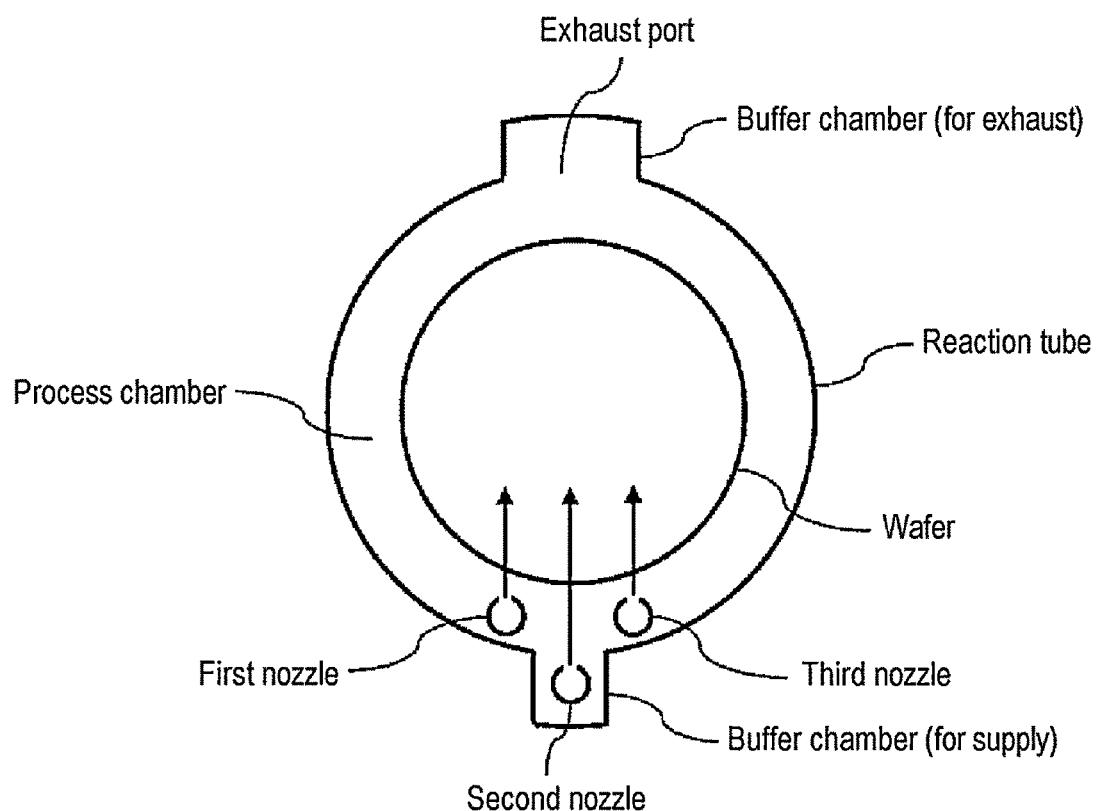

In the aforementioned embodiment, there has been described an example in which the first to third nozzles (nozzles 249a to 249c) as the first to third supply parts are installed in the process chamber so as to extend along the inner wall of the reaction tube. However, the present disclosure is not limited to the aforementioned embodiment. For example, as illustrated in a cross-sectional structure of a vertical type process furnace in FIG. 10A, a buffer chamber is installed on a side wall of a reaction tube, and first to third nozzles having the same configuration as in the aforementioned embodiment may be installed in the buffer chamber in the same arrangement manner as in the aforementioned embodiment. In FIG. 10A, there is illustrated an example in which a buffer chamber for supply and a buffer chamber for exhaust are installed on the side wall of the reaction tube, and are respectively disposed at positions facing each other with the wafer interposed therebetween. Furthermore, each of the supply buffer chamber and the exhaust buffer chamber is installed from a lower portion of the side wall of the reaction tube to an upper portion of the side wall of the reaction tube, namely along the wafer arrangement region. In addition, FIG. 10A illustrates an example in which the supply buffer chamber is partitioned into a plurality (three) of spaces, and the respective nozzles are arranged in the respective spaces. The arrangement of the three spaces of the buffer chamber is similar to the arrangement of the first to third nozzles. The respective spaces in which the first to third nozzles are arranged may be referred to as first to third buffer chambers. The first nozzle and the first buffer chamber, the second nozzle and the second buffer chamber, and the third nozzle and the third buffer chamber may be regarded as a first supply part, a second supply part, and a third supply part, respectively. Furthermore, for example, as illustrated in the cross-sectional structure of the vertical type process furnace in FIG. 10B, a buffer chamber is installed in the same arrangement as in FIG. 10A, a second nozzle is installed in the buffer chamber, and the first and third nozzles may be installed so as to be provided at both sides of a communication part of the buffer chamber with the process chamber and along the inner wall of the reaction tube. The first nozzle, the second nozzle, the buffer chamber, and the third nozzle may also be regarded as a first supply part, a second supply part, and a third supply part, respectively. The components other than the buffer chamber and the reaction tube described in FIGS. 10A and 10B are similar to those of the respective components of the process furnace illustrated in FIG. 1. Even in the case of using this process furnace, the cleaning process in the process chamber and the supply part (the nozzle or buffer chamber) may be performed in the same manner as in the aforementioned embodiment, and the same effects as those of the aforementioned embodiment may be achieved.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, for example, a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type process furnace. The present disclosure is not limited to the aforementioned embodiment but may be appropriately applied to a case where films are formed using a substrate processing apparatus provided with a cold-wall-type process furnace.

In the case of using these substrate processing apparatuses, substrate processing or a cleaning process may be performed by the sequence and processing condition similar to those of the embodiment and modifications described above. Effects similar to those of the embodiment and modifications described above may be achieved.

The embodiments, modifications and the like described above may be appropriately combined with one another. The processing procedure and processing condition at this time may be similar to, for example, the processing procedures and processing condition of the aforementioned embodiment.

Examples

Figure 8A:
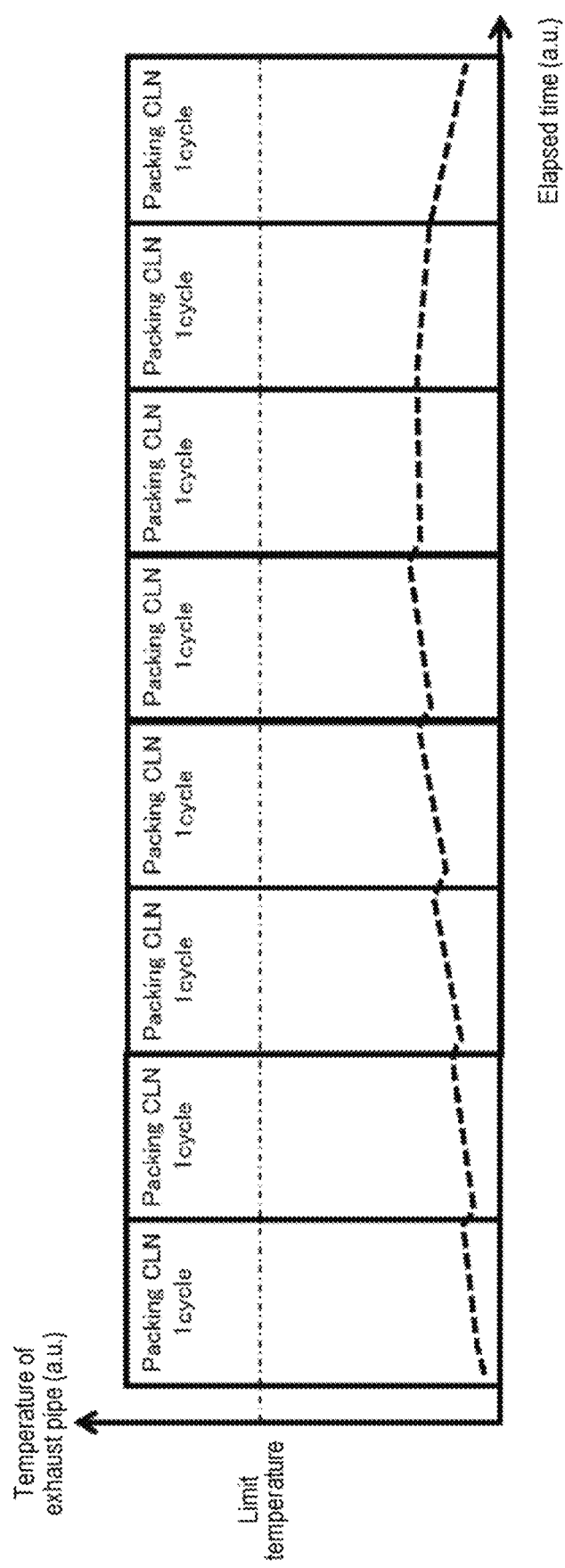
FIG. 8A and FIG. 8B are diagrams illustrating changes in temperature of an exhaust pipe when the cleaning process is performed.

In example 1, the aforementioned substrate processing (SiN film formation) was performed using the substrate processing apparatus illustrated in FIG. 1, and then the cleaning process illustrated in FIG. 4 was performed while measuring the temperature of the exhaust pipe. In example 1, as illustrated in FIG. 8A, a cycle (packing CLN) which sequentially performs steps a and b illustrated in FIG. 4 was performed eight times. That is, in example 1, only the packing CLN was repeatedly performed. The processing condition of each step of the substrate processing and the cleaning process were set to a predetermined condition which falls within the processing condition range described in the aforementioned embodiment.

Figure 8B:
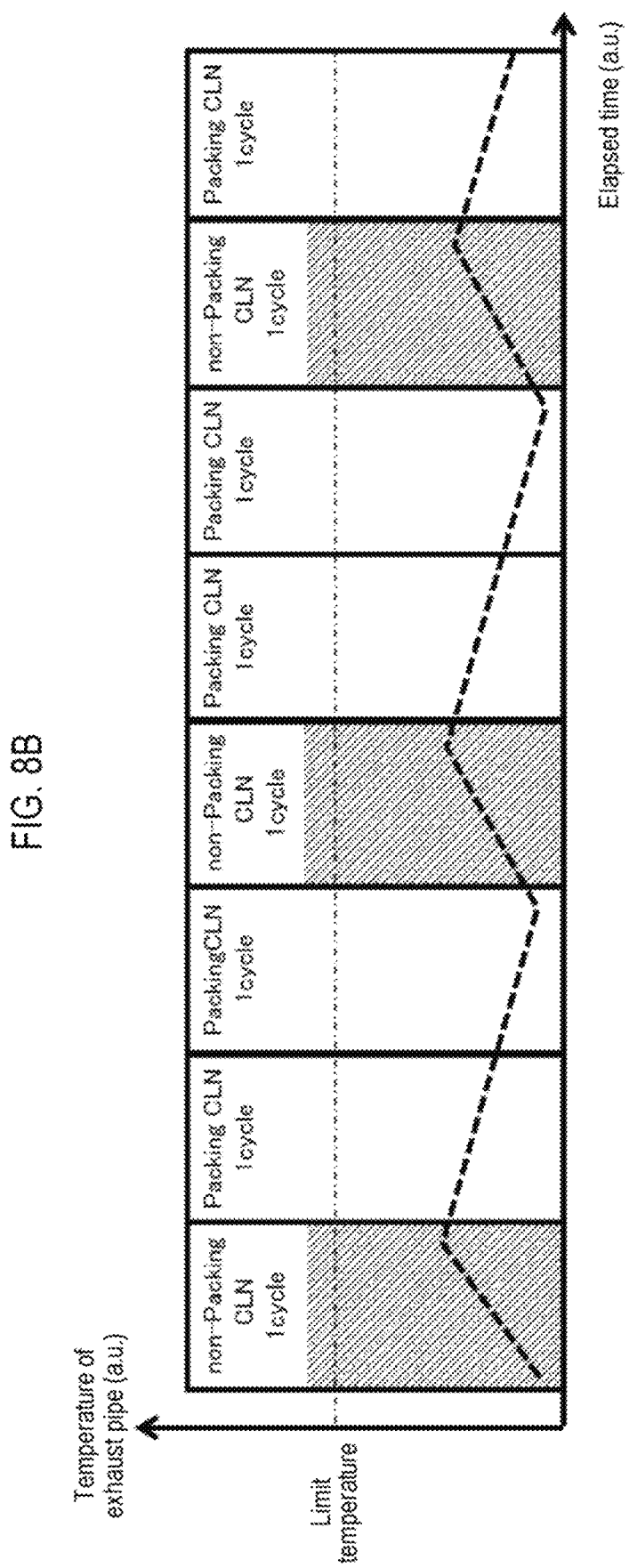

In example 2, after the aforementioned substrate processing (SiN film formation) was performed using the substrate processing apparatus illustrated in FIG. 1, the cleaning process illustrated in FIG. 4 and the cleaning process illustrated in FIG. 5 were alternately performed while measuring the temperature of the exhaust pipe. In example 2, as illustrated in FIG. 8B, a cycle (non-packing CLN) which sequentially performs steps a and b illustrated in FIG. 5 was performed in $1^{st}$, $4^{th}$, and $7^{th}$ cycles, and a cycle (the packing CLN) which sequentially performs steps a and b illustrated in FIG. 4 was performed in $2^{nd}$, $3^{rd}$, $5^{th}$, $6^{th}$, and 8th cycles. That is, in example 2, the packing CLN and the non-packing CLN were performed in combination, and at that time, the non-packing CLN was performed before the packing CLN. The processing condition of each step of the substrate processing and the cleaning process were set to the predetermined condition which falls within the processing condition range described in the aforementioned embodiment.

Figure 9A:
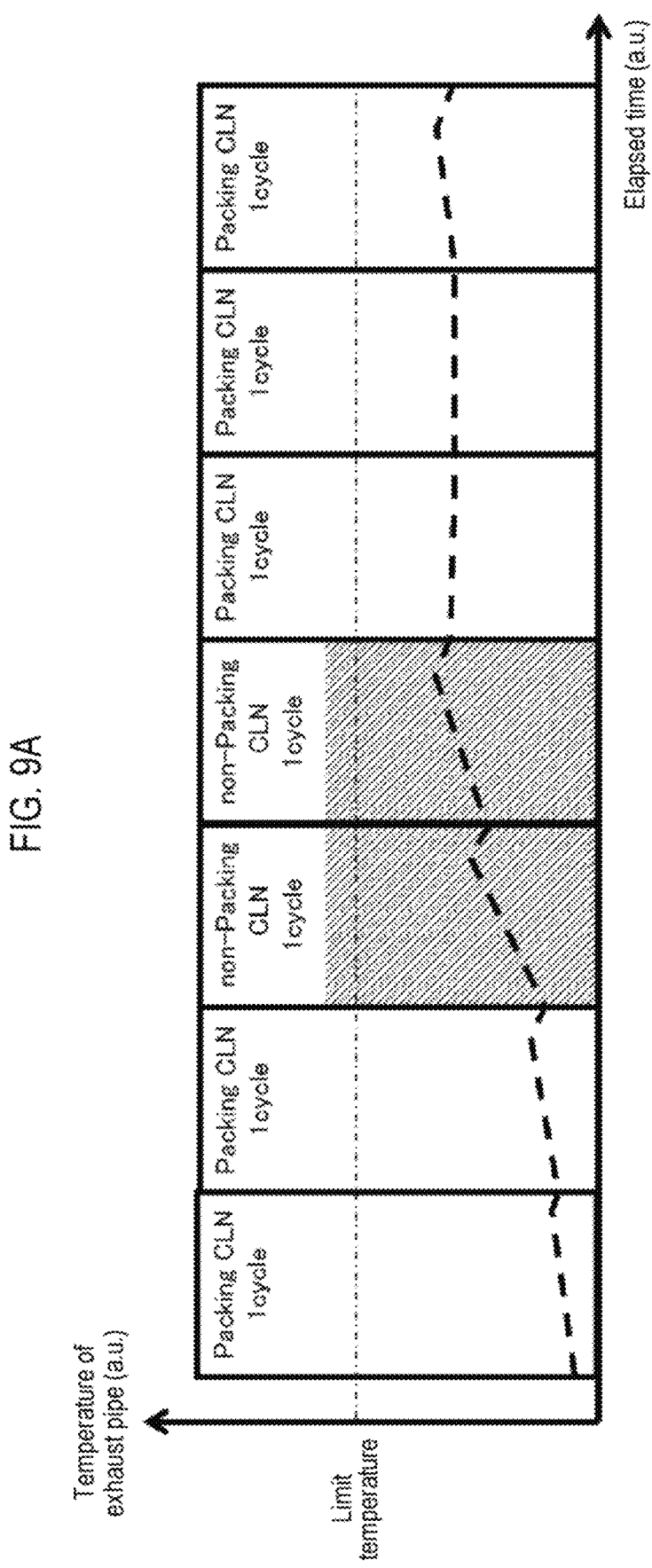
FIGS. 9A and 9B are diagrams illustrating changes in temperature of the exhaust pipe when the cleaning process is performed.

In example 3, after the aforementioned substrate processing (SiN film formation) was performed using the substrate processing apparatus illustrated in FIG. 1, the cleaning process illustrated in FIG. 4 and the cleaning process illustrated in FIG. 5 were alternately performed while measuring the temperature of the exhaust pipe. In example 3, as illustrated in FIG. 9A, a cycle (packing CLN) which sequentially performs steps a and b illustrated in FIG. 4 was performed in $1^{st}$, $2^{nd}$, and $5^{th}$ to $7^{th}$ cycles, and a cycle (non-packing CLN) which sequentially performs steps a and b illustrated in FIG. 5 was performed in $3^{rd}$ and $4^{th}$ cycles. That is, in example 3, the packing CLN and the non-packing CLN were performed in combination, and at that time, the packing CLN was performed before the non-packing CLN. The processing condition at each step of the substrate processing and the cleaning process were set to the predetermined condition which falls within the processing condition range described in the aforementioned embodiment.

Figure 9B:
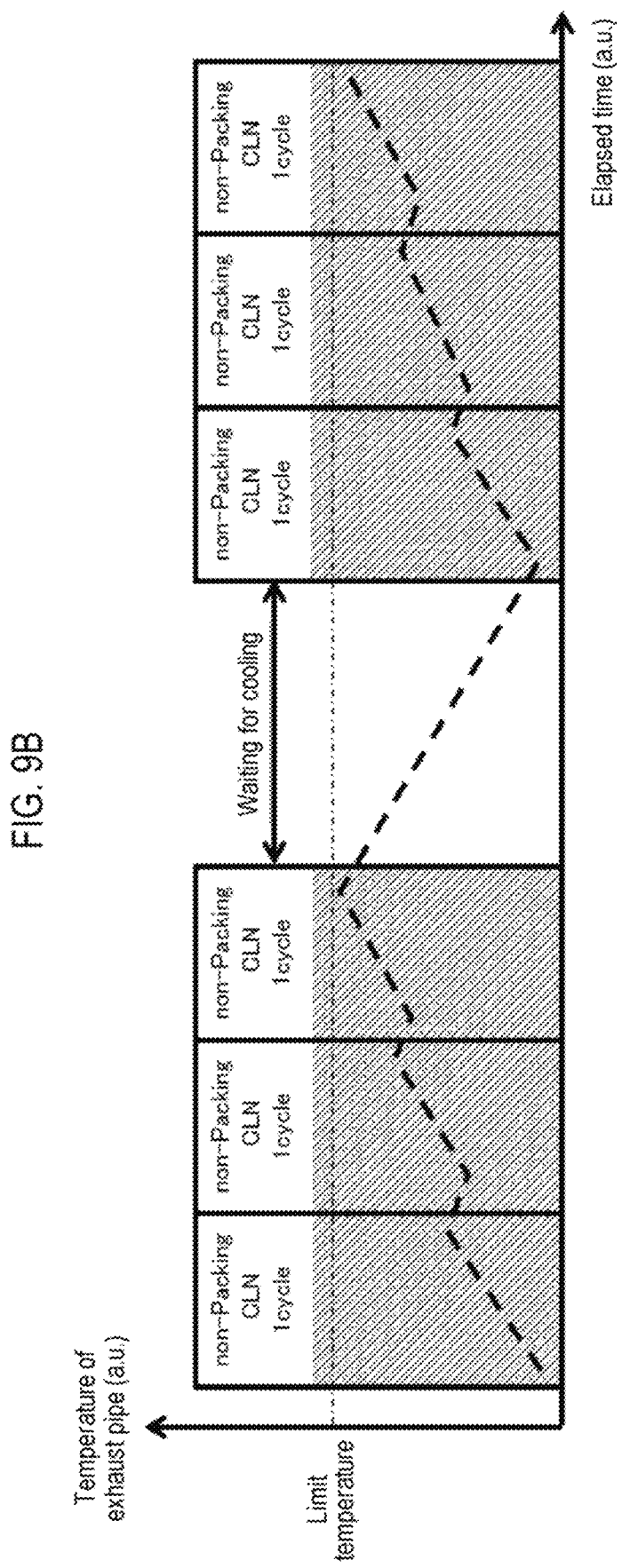

In example 4, after the aforementioned substrate processing (SiN film formation) was performed using the substrate processing apparatus illustrated in FIG. 1, the cleaning process illustrated in FIG. 5 was performed while measuring the temperature of the exhaust pipe. In example 4, as illustrated in FIG. 9B, a cycle (non-packing CLN) which sequentially performs steps a and b illustrated in FIG. 5 was performed six times. That is, in example 4, only the non-packing CLN was repeatedly performed. The processing condition of each step of the substrate processing and the cleaning process were set to a predetermined condition which falls within the processing condition range described in the aforementioned embodiment.

FIGS. 8A, 8B, 9A, and 9B show changes in temperature of the exhaust pipe when the cleaning processes of examples 1 to 4 were performed, respectively. In these drawings, the horizontal axis indicates an elapsed time (a.u.) and the vertical axis indicates a temperature of the exhaust pipe (a.u.). In these drawings, a limit temperature (e.g., about 150 to 200 degrees C.), which is a temperature at which corrosion occurs in the exhaust pipe, is indicated by an alternate short and long dash line.

As illustrated in FIG. 8A, in example 1 in which only the packing CLN was repeatedly performed, it was possible to effectively suppress the temperature rise of the exhaust pipe while uniformly performing the cleaning process in the process container and in the nozzles.

As illustrated in FIG. 8B, in example 2 in which the non-packing CLN was performed before the packing CLN, the temperature of the exhaust pipe rises at a higher rate than example 1 at each time of performing the non-packing CLN, and thus it was possible to appropriately suppress the temperature of the exhaust pipe such that the temperature of the exhaust pipe does not exceed the limit temperature while uniformly performing the cleaning process in the process container and in the nozzles. In this example, by performing the packing CLN at an appropriate timing, that is, by preparing a period during which the exhaust system is closed and the reaction between the $F_2$ gas or the like and the reaction byproduct in the exhaust pipe is temporarily stopped at an appropriate timing, it was possible to avoid an excessive rise in temperature of the exhaust pipe.

As illustrated in FIG. 9A, in example 3 in which the packing CLN was performed before the non-packing CLN, there is temporarily a period during which the temperature of the exhaust pipe rises at a higher rate than in example 1, it was possible to make the temperature rise rate of the exhaust pipe gentle while uniformly performing the cleaning process in the process container and in the nozzles. In this example, by performing the packing CLN in advance (in $1^{st}$ and $2^{nd}$ cycles) before the non-packing CLN is performed, it was possible to remove most of the reaction byproduct adhering to the interior of the exhaust pipe while suppressing the temperature rise of the exhaust pipe as in example 1. Thus, in this example, it was possible to more suppress the temperature rise rate of the exhaust pipe at the time ($3^{rd}$ and $4^{th}$ cycles) of performing the non-packing CLN than the temperature rise rate of the exhaust pipe at the time of performing the non-packing CLN at the first time ($1^{st}$ cycle) of the cleaning process in example 2.

As illustrated in FIG. 9B, in example 4 in which only the non-packing CLN was repeatedly performed, although it was possible to uniformly perform the cleaning process in the process container and in the nozzles, the temperature rise of the exhaust pipe increased compared with examples 1 to 3. In example 4, in order to prevent the temperature of the exhaust pipe from exceeding the limit temperature, it was necessary to prepare a waiting time for waiting for cooling when performing the non-packing CLN, for example, about three times.

According to the present disclosure in some embodiments, it is possible to improve uniformity of a cleaning process in a process container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of cleaning a member in a process container by performing a cycle multiple times, the cycle comprising:
   (a) separately supplying a cleaning gas and an additive gas that reacts with the cleaning gas from a first supply part and a second supply part that is different from the first supply part, respectively, among at least three supply parts, into the process container; and
   (b) separately supplying the cleaning gas and the additive gas from the second supply part and the first supply part, respectively, among the at least three supply parts, into the process container,
   wherein (a) and (b) include:
     stopping the supply of the cleaning gas and the additive gas into the process container; and
     exhausting an interior of the process container, and
   wherein in at least one selected from the group of (a) and (b), an inert gas is supplied from each of the at least three supply parts at a same flow rate, after the supply of the cleaning gas and the additive gas into the process container is stopped and before the interior of the process container is exhausted.

2. The method of claim 1, wherein in at least one selected from the group of (a) and (b), the inert gas is supplied from each of the at least three supply parts without exhausting the interior of the process container, after the supply of the cleaning gas and the additive gas into the process container is stopped and before the interior of the process container is exhausted.

3. The method of claim 1, wherein in at least one selected from the group of (a) and (b), the inert gas is supplied from each of the at least three supply parts while maintaining a state where the cleaning gas and the additive gas are confined in the process container, after the supply of the cleaning gas and the additive gas into the process container is stopped and before the interior of the process container is exhausted.

4. The method of claim 1, wherein in at least one selected from the group of (a) and (b), the inert gas is supplied from each of the at least three supply parts while maintaining a state where the cleaning gas and the additive gas are confined in the process container without exhausting the interior of the process container, after the supply of the cleaning gas and the additive gas into the process container is stopped and before the interior of the process container is exhausted.

5. The method of claim 1, wherein in at least one selected from the group of (a) and (b), the cleaning gas and the additive gas, which are supplied into the process container, are allowed to enter into each of the at least three supply parts, after the supply of the cleaning gas and the additive gas into the process container is stopped and before the interior of the process container is exhausted.

6. The method of claim 1, wherein the cycle includes a cycle A and a cycle B,
   wherein the cycle A includes (a) and (b), and at least one selected from the group of (a) and (b) includes:
     (c) supplying the cleaning gas and the additive gas into the process container without exhausting the interior of the process container; and
     (d) stopping the supply of the cleaning gas and the additive gas into the process container and maintaining a state where the cleaning gas and the additive gas are confined in the process container without exhausting the interior of the process container, and
   wherein the cycle B includes:
     (e) separately supplying the cleaning gas and the additive gas from the first supply part and the second supply part, respectively, among the at least three supply parts, into the process container with exhausting the interior of the process container; and
     (f) separately supplying the cleaning gas and the additive gas from the second supply part and the first supply part, respectively, among the at least three supply parts, into the process container with exhausting the interior of the process container.

7. The method of claim 6, wherein the cycle A is performed before the cycle B.

8. The method of claim 1, wherein (a) and (b) are performed at a processing temperature of not less than 200 degrees C. and less than 400 degrees C.

9. The method of claim 1, wherein (a) and (b) are performed at a processing temperature which ranges from 200 to 350 degrees C.

10. The method of claim 1, wherein at least one selected from the group of (a) and (b) includes:

(c) supplying the cleaning gas and the additive gas into the process container without exhausting the interior of the process container; and (d) stopping the supply of the cleaning gas and the additive gas into the process container and maintaining a state where the cleaning gas and the additive gas are confined in the process container without exhausting the interior of the process container.

11. The method of claim 10, wherein in (c), the cleaning gas and the additive gas, which are supplied into the process container, are allowed to enter into a third supply part, which does not supply the cleaning gas and the additive gas, among the at least three supply parts, through a gas injection hole of the third supply part, and wherein in (d), the cleaning gas and the additive gas, which are confined in the process container, are allowed to enter into at least the third supply part, which does not supply the cleaning gas and the additive gas in (c), through at least the gas injection hole of the third supply part.

12. The method of claim 11, wherein in (d), the cleaning gas and the additive gas, which are confined in the process container, are allowed to enter into the at least three supply parts through respective holes of the at least three supply parts.

13. The method of claim 1, wherein the cycle is performed a first number of multiple times, and the cycle is performed a second number of multiple times following a cooling period after the first number of multiple times.

14. The method of claim 1, wherein a plurality of gas injection holes of a third supply part are arranged to be interposed between a plurality of gas injection holes of the first supply part and a plurality of gas injection holes of the second supply part.

15. The method of claim 1, wherein in at least one of (a) and (b), when the cleaning gas and the additive gas are supplied into the process container, an inert gas is supplied into the process container from a gas injection hole of a third supply part, among the at least three supply parts, which does not supply the cleaning gas and the additive gas, at a flow rate that is smaller than each of a flow rate of the cleaning gas supplied into the process container and a flow rate of the additive gas supplied into the process container.

16. A method of manufacturing a semiconductor device, comprising:

cleaning a member in a process container, the cleaning including performing a cycle multiple times, the cycle including:

(a) separately supplying a cleaning gas and an additive gas that reacts with the cleaning gas from a first supply part and a second supply part that is different from the first supply part, respectively, among at least three supply parts, into the process container; and (b) separately supplying the cleaning gas and the additive gas from the second supply part and the first supply part, respectively, among the at least three supply parts, into the process container, wherein (a) and (b) include:
stopping the supply of the cleaning gas and the additive gas into the process container; and
exhausting an interior of the process container, and wherein in at least one selected from the group of (a) and (b), an inert gas is supplied from each of the at least three supply parts at a same flow rate, after the supply of the cleaning gas and the additive gas into the process container is stopped and before the interior of the process container is exhausted.

17. A substrate processing apparatus, comprising:
a process container;
at least three supply parts configured to supply a gas into the process container;
a cleaning gas supply system configured to supply a cleaning gas into the process container;
an additive gas supply system configured to supply an additive gas that reacts with the cleaning gas into the process container; and
a controller configured to control the cleaning gas supply system and the additive gas supply system so as to clean a member in the process container by performing a cycle multiple times, the cycle including:

(a) separately supplying the cleaning gas and the additive gas from a first supply part and a second supply part that is different from the first supply part, respectively, among the at least three supply parts, into the process container; and (b) separately supplying the cleaning gas and the additive gas from the second supply part and the first supply part, respectively, among the at least three supply parts, into the process container, wherein (a) and (b) include:
stopping the supply of the cleaning gas and the additive gas into the process container; and
then, exhausting an interior of the process container, and wherein in at least one selected from the group of (a) and (b), an inert gas is supplied from each of the at least three supply parts at a same flow rate, after the supply of the cleaning gas and the additive gas into the process container is stopped and before the interior of the process container is exhausted.

18. A non-transitory computer-readable recording medium storing a program that causes, by a computer, a substrate processing apparatus to perform a process of cleaning a member in a process container by performing a cycle multiple times, the cycle comprising:

(a) separately supplying a cleaning gas and an additive gas that reacts with the cleaning gas from a first supply part and a second supply part that is different from the first supply part, respectively, among at least three supply parts, into the process container; and (b) separately supplying the cleaning gas and the additive gas from the second supply part and the first supply part, respectively, among the at least three supply parts, into the process container, wherein (a) and (b) include:
stopping the supply of the cleaning gas and the additive gas into the process container; and
exhausting an interior of the process container, and wherein in at least one selected from the group of (a) and (b), an inert gas is supplied from each of the at least three supply parts at a same flow rate, after the supply of the cleaning gas and the additive gas into the process container is stopped and before the interior of the process container is exhausted.

* * * * *